(12) United States Patent
Baek et al.

(10) Patent No.: US 11,329,247 B2
(45) Date of Patent: May 10, 2022

(54) ELECTRONIC DEVICE COMPRISING FLEXIBLE DISPLAY

(71) Applicant: Samsung Electronics Co., Ltd., Gyeonggi-do (KR)

(72) Inventors: Moo-Hyun Baek, Gyeonggi-do (KR); Jae-Young Shin, Gyeonggi-do (KR); Young-Soo Chun, Gyeonggi-do (KR); Seung-Min Choi, Gyeonggi-do (KR); Byoung-Uk Yoon, Gyeonggi-do (KR); So-Young Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 16/962,926

(22) PCT Filed: Sep. 11, 2018

(86) PCT No.: PCT/KR2018/010595
§ 371 (c)(1),
(2) Date: Jul. 17, 2020

(87) PCT Pub. No.: WO2019/146865
PCT Pub. Date: Aug. 1, 2019

(65) Prior Publication Data
US 2021/0135151 A1 May 6, 2021

(30) Foreign Application Priority Data
Jan. 29, 2018 (KR) .......................... 10-2018-0010608

(51) Int. Cl.
*G06F 3/045* (2006.01)
*H01L 51/52* (2006.01)
(Continued)

(52) U.S. Cl.
CPC .......... *H01L 51/5237* (2013.01); *G06F 3/046* (2013.01); *H04N 5/2257* (2013.01);
(Continued)

(58) Field of Classification Search
USPC ........ 345/174, 172, 205; 340/815.4; 726/27; 455/575.4; 361/679.01
See application file for complete search history.

(56) References Cited

U.S. PATENT DOCUMENTS

2005/0040962 A1\* 2/2005 Funkhouser .......... G06F 1/1615
340/815.4
2006/0248597 A1\* 11/2006 Keneman ................ G06F 21/32
726/27
(Continued)

FOREIGN PATENT DOCUMENTS

KR 10-2016-0041159 A 4/2016
KR 10-2016-0087460 A 7/2016
(Continued)

OTHER PUBLICATIONS

European Search Report dated Feb. 26, 2021.
Korean Search Report dated Jan. 5, 2022.

*Primary Examiner* — Thuy N Pardo
(74) *Attorney, Agent, or Firm* — Cha & Reiter, LLC

(57) ABSTRACT

According to various embodiments of the present invention, an electronic device can comprise: a housing; a flexible display of which at least a portion is accommodated in the housing, wherein the flexible display comprises a window forming at least a portion of the outer side surface of the
(Continued)

electronic device, a light-emitting layer arranged below the window, and a protective layer arranged below the light-emitting layer, a transparent region for transmitting light incident from the outside of the electronic device is formed in a portion of a region of the light-emitting layer, and an opening of which at least a portion is aligned with the transparent region is formed in a portion of a region of the protective layer; and a sensor of which at least a portion is accommodated in the housing and at least a portion is aligned with the opening. The electronic device can vary according to embodiments.

15 Claims, 15 Drawing Sheets

(51) Int. Cl.
  *G06F 3/046* (2006.01)
  *H04N 5/225* (2006.01)
  *H01L 27/32* (2006.01)
  *H04B 1/38* (2015.01)

(52) U.S. Cl.
  CPC .... *G06F 2203/04102* (2013.01); *H01L 27/32* (2013.01); *H01L 2251/5338* (2013.01); *H04B 1/38* (2013.01); *H04N 5/2253* (2013.01)

(56) References Cited

U.S. PATENT DOCUMENTS

| | | | |
|---|---|---|---|
| 2011/0275422 A1* | 11/2011 | Kemppinen | H04M 1/0237 455/575.4 |
| 2013/0094126 A1* | 4/2013 | Rappoport | G09G 3/3208 361/679.01 |
| 2016/0100478 A1 | 4/2016 | Lee | |
| 2016/0202781 A1* | 7/2016 | Kim | G06F 3/041 345/173 |
| 2016/0266672 A1* | 9/2016 | Inagaki | G06F 3/042 |
| 2017/0140504 A1* | 5/2017 | Jeong | G06T 3/40 |
| 2017/0212613 A1 | 7/2017 | Hwang et al. | |
| 2017/0227994 A1* | 8/2017 | Hsu | G06F 1/1652 |
| 2017/0289324 A1 | 10/2017 | Yeo et al. | |
| 2018/0188778 A1* | 7/2018 | Shin | G06F 1/1652 |
| 2018/0198896 A1* | 7/2018 | Kang | H04M 1/0268 |
| 2018/0279489 A1* | 9/2018 | Ochi | H05K 5/0004 |
| 2019/0346889 A1* | 11/2019 | Chen | H04M 1/0216 |

FOREIGN PATENT DOCUMENTS

| | | |
|---|---|---|
| KR | 10-2017-0006055 A | 1/2017 |
| KR | 10-2017-0081559 A | 7/2017 |
| KR | 10-2017-0087635 A | 7/2017 |
| KR | 10-2017-0112790 A | 10/2017 |

* cited by examiner

ELECTRONIC DEVICE COMPRISING FLEXIBLE DISPLAY

CROSS REFERENCE TO RELATED APPLICATIONS

This application is a National Phase Entry of PCT International Application No. PCT/KR2018/010595, which was filed on Sep. 11, 2018, and claims a priority to Korean Patent Application No. 10-2018-0010608, which was filed on Jan. 29, 2018, the contents of which are incorporated herein by reference.

TECHNICAL FIELD

Various embodiments of the disclosure relate to an electronic device. For example, various embodiments relate to an electronic device including a flexible display.

BACKGROUND ART

As the demand for mobile communication increases while the degree of integration of electronic devices increases, portability and convenience of use of multimedia functions and the like may be improved in electronic devices such as mobile communication terminals. For example, by incorporating a traditional mechanical (button-type) keypad into a display via a touch-screen function, the display is capable of providing a larger screen. For example, a display incorporating a touch-screen function is capable of improving the portability of an electronic device while at least maintaining the usability thereof (e.g., the usability of a mechanical keypad) in inputting characters or the like. In another embodiment, an electronic device provided with a display incorporating a touch-screen function is able to provide a larger screen than an electronic device including a mechanical keypad if the two electronic devices are equally portable, for example, if the two electronic devices have the same size and weight.

When using a web surfing or multimedia function, an electronic device outputting a larger screen may be more convenient to use. A larger display may be mounted on an electronic device in order to output a larger screen, but considering the portability of the electronic device, it may be difficult to increase the size of the display. A display using an organic light-emitting diode or the like may make it possible to ensure the portability of an electronic device while providing a larger screen. For example, a display using an organic light-emitting diode (or an electronic device provided with such a display) is able to realize stable operation even if it is manufactured considerably thin. Thus, the display may be mounted on an electronic device in a foldable or rollable form.

DETAILED DESCRIPTION OF THE INVENTION

Technical Problem

When mounting a flexible display to a structure such as a housing of an electronic device, visual or tactile heterogeneity may occur between areas that are attached and fixed in direct contact with the structure and other areas. For example, a flexible display that is manufactured thin enough to be foldable or rollable may be curved in the exterior of the attached area depending on the cured state of adhesive or a seating member, thereby marring the appearance of the display or electronic device.

In some embodiments, for arrangement of hardware such as a receiver, a proximity sensor, an illumination sensor, and the like, the flexible display may include an inactive area, and at least a portion of the inactive area may be attached to the structure. Depending on the product design, the inactive area may be formed as an area that does not substantially output a screen, and a display panel (e.g., a light-emitting layer), a touch screen panel, a polarization layer, or the like may not be disposed in the inactive area. For example, in the inactive area, only a transparent layer of a flexible display (e.g., a window film provided as a window) may be disposed, and thus the flexible display may have a smaller thickness. For example, when bonding the inactive area to a structure, the visual or tactile heterogeneity in appearance may be greater.

Various embodiments of the disclosure are able to provide a flexible display having an improved appearance while being manufactured thin enough to be foldable or rollable, and to provide an electronic device including the flexible display.

Technical Solution

According to various embodiments, an electronic device may include: a guide housing: a slide housing slidably coupled to the guide housing, wherein the slide housing includes an inner plate having a first face that faces an outside of the electronic device and a second face that faces away from the first face, and a first opening formed to penetrate the first face and the second face; a display mounted on the first face, wherein the display includes a substantially transparent window including a flexible area forming the outer face of the display, a light-emitting layer disposed under the window, a substantially opaque protective layer disposed under the light-emitting layer, and a second opening formed in the protective layer and at least partially overlapping the first opening in a vertical direction; a transparent polymeric material filling at least a portion of the second opening; and an image sensor at least partially accommodated in the guide housing and at least partially aligned with the first opening under the inner plate.

According to various embodiments, an electronic device may include: a housing; a flexible display at least partially accommodated in the housing, wherein the flexible display includes a window forming at least a portion of the outer surface of the electronic device, a light-emitting layer disposed under the window, and a protective layer disposed under the light-emitting layer, and wherein a transparent area is formed in a partial area of the light-emitting layer so as to transmit light incident from outside the electronic device and an opening at least partially aligned with the transparent area is formed in a partial area of the protective layer; and a sensor at least partially accommodated in the housing and at least partially aligned with the opening.

According to various embodiments, an electronic device may include: an inner plate including a first opening; at least one transparent window including a flexible layer forming a portion of the outer face of the electronic device; at least one protective layer disposed under the window, wherein the protective layer includes a second opening overlapping the first opening when viewed from above the window; and a transparent polymeric material filling at least a portion of the second opening.

Advantageous Effects

According to various embodiments of the disclosure, in a flexible display, a display panel (e.g., a light-emitting layer) is disposed on an area attached to another structure, for example, the housing of the electronic device. Thus, it is possible to form the thickness of the entire flexible display substantially uniformly. For example, it is possible to improve visual or tactile heterogeneity even when the flexible display is attached to another structure. In some embodiments, an image sensor, a fingerprint sensor, an iris sensor, a proximity sensor, an illuminance sensor, or the like may be disposed to correspond to a portion of the flexible display, and the flexible display, for example, a light-emitting layer, may include a transparent area in an area corresponding to the sensor(s). For example, the flexible display is capable of providing a stable operating environment for various sensors while providing an incident or exit path of light in an area corresponding to the sensors.

MODE FOR CARRYING OUT THE INVENTION

Figure 1:
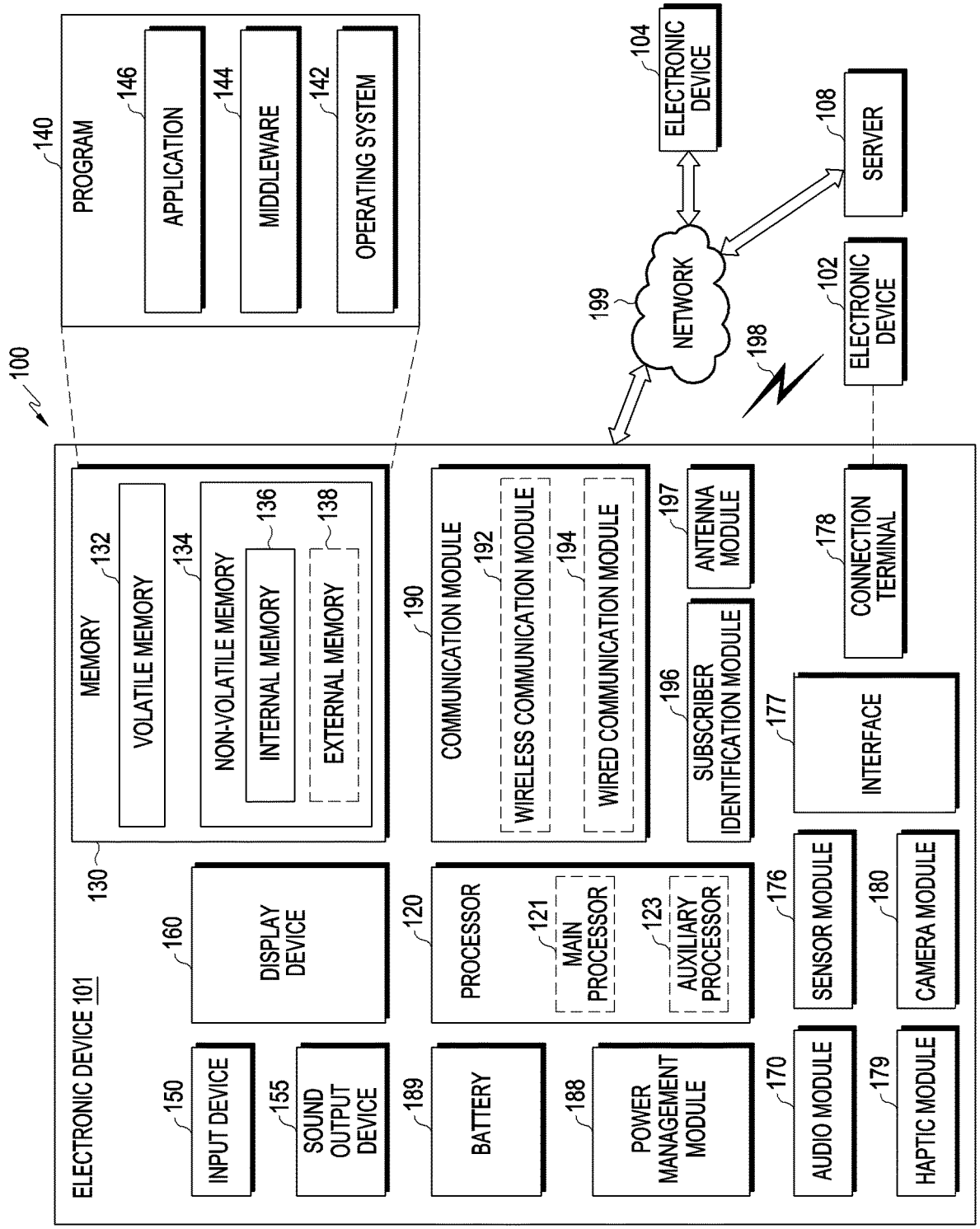
FIG. 1 is a block diagram illustrating an electronic device within a network environment according to various embodiments of the disclosure.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the disclosure.

Ordinal terms such as "first" or "second" may be used to describe, not limiting, various components. These expressions are used to distinguish one component from another component. For example, a first component may be referred to as a second component, and vice versa without departing from the scope of the disclosure. The term 'and/or' includes one or a combination of two or more of a plurality of enumerated items.

Relative terms described with respect to what is seen in the drawings, such as "front surface," "rear surface," "top surface," and "bottom surface" may substitute for ordinal numbers such as "first" and "second." The sequence of ordinal numbers such as "first" and "second" is determined in a mentioned order or an arbitrary order, and may be changed arbitrarily when needed.

The terms as used in the disclosure are provided to merely describe specific embodiments, not intended to limit the scope of the disclosure. It is to be understood that singular forms include plural referents unless the context clearly dictates otherwise. In the disclosure, the term "include" or "have" signifies the presence of a feature, number, operation, component, part, or a combination thereof described in the disclosure, not excluding the presence of one or more other features, numbers, operations, components, parts, or a combination thereof.

Unless otherwise defined, the terms and words including technical or scientific terms used herein may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

In the disclosure, the electronic device may be an arbitrary device including a touch panel, and the electronic device may be referred to as a terminal, a portable terminal, a mobile terminal, a communication terminal, a portable communication terminal, a portable mobile terminal, and a display device.

For example, the electronic device may be a smartphone, a portable phone, a navigation device, a gaming device, a TV, a head unit for a vehicle, a notebook computer, a laptop computer, a tablet computer, a personal media player (PMP), and a person digital assistant (PDA). The electronic device may be implemented as a portable communication terminal of a pocket size, which has a wireless communication function. Further, the electronic device may be a flexible device or a flexible display device.

The electronic device may communicate with an external electronic device, such as a server, and may perform an operation in conjunction with an external electronic device. For example, the electronic device may transmit an image captured by a camera or location information detected by a sensor unit, to a server through a network. The network is not limited thereto, but may be a mobile or cellular communication network, a local area network (LAN), a wireless local area network (WLAN), a wide area network (WAN), the internet, and a small area network (SAN).

FIG. 1 is a block diagram illustrating an electronic device 101 in a network environment 100 according to various embodiments.

Figure 2A:
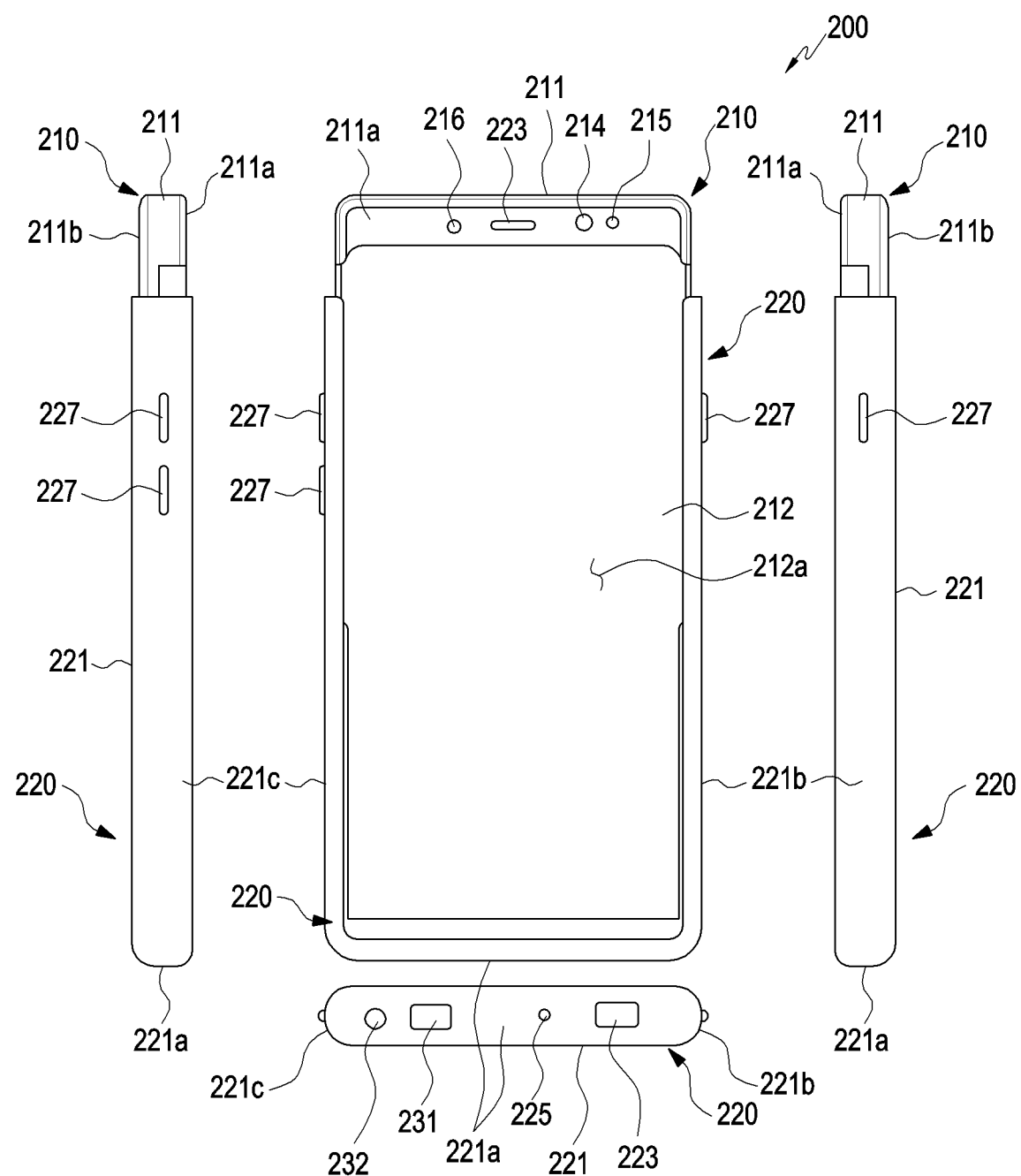
FIG. 2A is a view illustrating an electronic device according to various embodiments of the disclosure in the closed state.
Figure 2B:
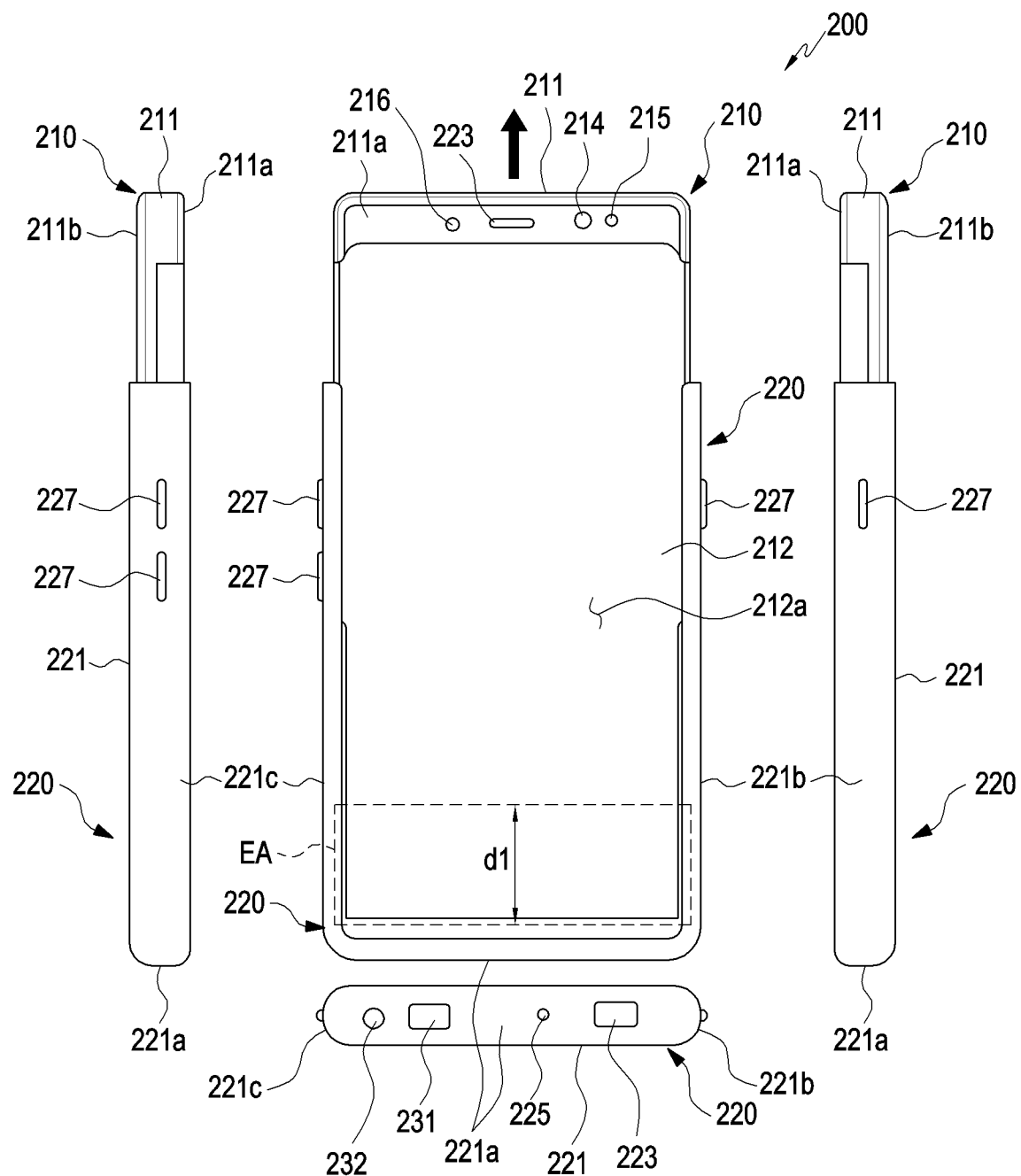
FIG. 2B is a view illustrating the electronic device according to various embodiments of the disclosure in the opened state.
Figure 2C:
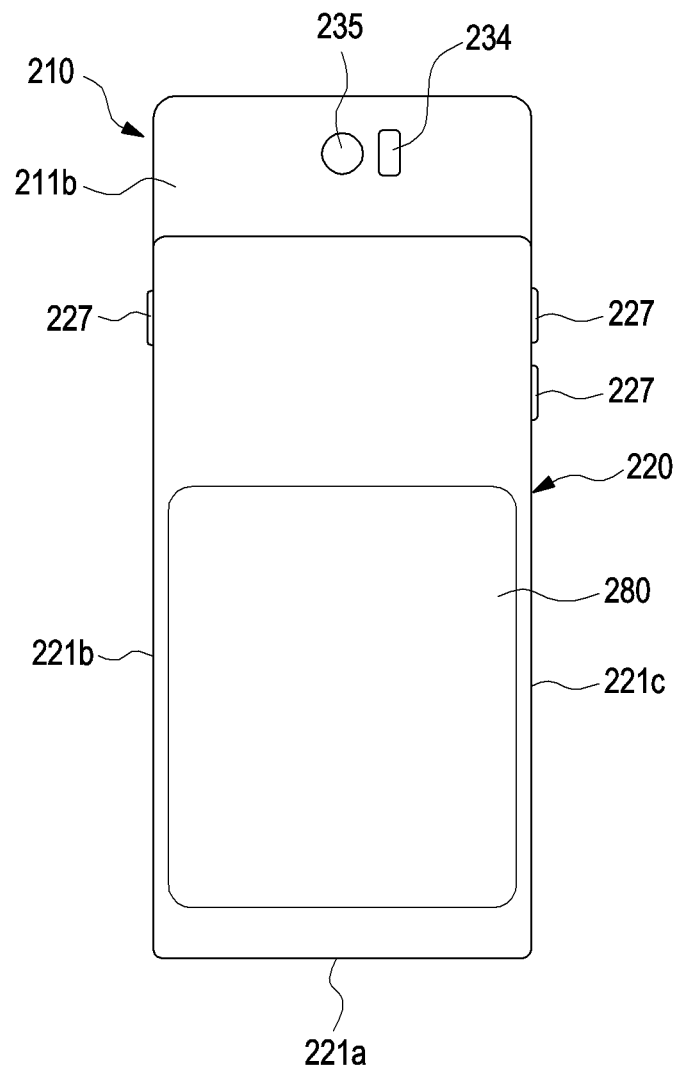
FIG. 2C is a view illustrating the rear face of the electronic device according to various embodiments of the disclosure.
Figure 3:
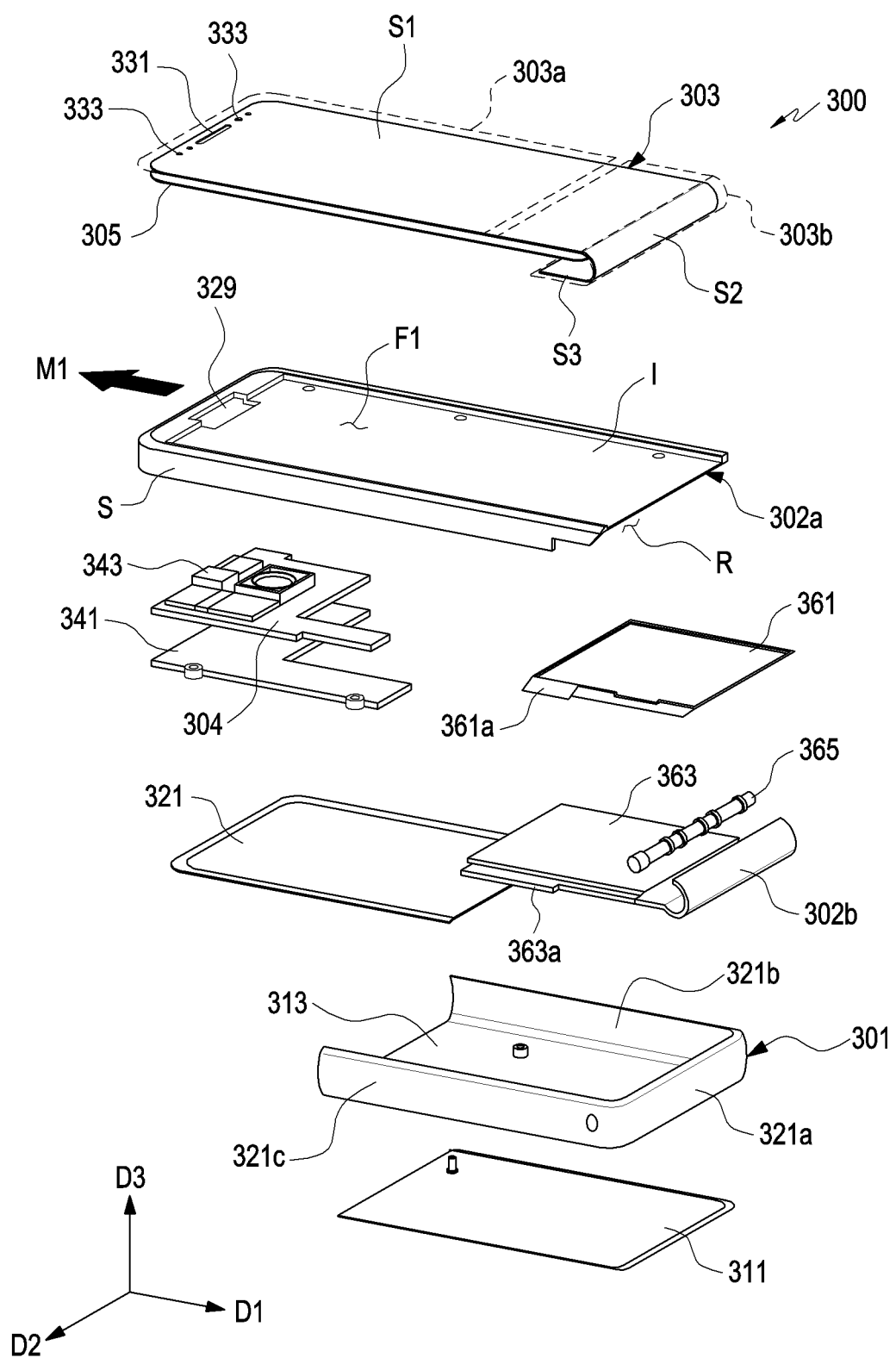
FIG. 3 is an exploded perspective view illustrating an electronic device according to various embodiments of the disclosure.

Referring to FIG. 1, the electronic device 101 in the network environment 100 may be, for example, the whole or part of an electronic device 200 or 300 of FIG. 2 or FIG. 3, and may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be integrated and implemented as in, for example, the sensor module 176 (e.g., a fingerprint sensor, an iris sensor, or an illuminance sensor) embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing and computation. The processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from the main processor 121. Additionally or alternatively, the auxiliary processor 123 may be adapted to consume less power than the main processor 121, or to be specific to a specified function. Here, the auxiliary processor 123 may be operated separately from or embedded in the main processor 121.

In such a case, the auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101, for example, software (e.g., the program 140) and input data or output data for a command related thereto. The memory 130 may include the volatile memory 132 or the non-volatile memory 134.

The program 140 is software stored in the memory 130, and may include, for example, an operating system (OS) 142, middleware 144, or an application 146.

The input device 150 is a device configured to receive a command or data to be used by a component (e.g., the processor 120) of the electronic device 101, from the outside (e.g., a user) of the electronic device 101, and may include, for example, a microphone, a mouse, or a keyboard.

The sound output device 155 is a device configured to output sound signals to the outside of the electronic device 101, and may include, for example, a speaker or a receiver. The speaker may be used for general purposes, such as playing multimedia or playing record, and the receiver may be used only for incoming calls. According to an embodiment, the receiver may be implemented as separate from, or as part of the speaker.

The display device 160 is a device configured to visually provide information to a user of the electronic device 101, and may include, for example, a display, a hologram device, or a projector and control circuitry to control a corresponding one of the display, hologram device, and projector. According to an embodiment, the display device 160 may include touch circuitry or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) wiredly or wirelessly coupled with the electronic device 101.

The sensor module 176 may generate an electrical signal or data value corresponding to an operational state (e.g., power or temperature) of the electronic device 101 or an environmental state external to the electronic device 101. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support specified protocols to be used for the electronic device 101 to be coupled with the external electronic device (e.g., the electronic device 102) wiredly or wirelessly. According to an embodiment, the interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102), for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 is a module configured to manage power supplied to the electronic device 101, and may be implemented as at least part of, for example, a power management integrated circuit (PMIC).

The battery 189 is a device configured to supply power to at least one component of the electronic device 101, and may include, for example, a primary cell which is not rechargeable, a secondary cell which is rechargeable, or a fuel cell.

The communication module 190 may support establishing a wired communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a wired communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules 190 may be implemented as a single chip in which at least some of the communication modules are integrated, or may be implemented as separate chips, respectively.

According to an embodiment, the wireless communication module 192 may identify and authenticate the electronic device 101 in a communication network, using user information stored in the subscriber identification module 196.

The antenna module 197 may include at least one antenna module for transmitting or receiving a signal or power to or from the outside of the electronic device 101. According to an embodiment, the communication module 190 (e.g., the wireless communication module 192) may transmit or receive a signal to or from the external electronic device via an antenna appropriate for a communication scheme.

FIGS. 2A and 2B are views illustrating an electronic device according to various embodiments in the opened and closed states, respectively. FIG. 2C is a view illustrating the rear face of the electronic device according to various embodiments of the disclosure.

FIG. 2A illustrates the state in which a first structure 210 is closed with respect to a second structure 220, and FIG. 2B illustrates the state in which the first structure 210 is opened with respect to the second structure 220.

Referring to FIGS. 2A, 2B, and 2C, an electronic device 200 may include the first structure 210 and the second structure 220, which is movably disposed on the first structure 210. According to an embodiment, the first structure 210 may be disposed to be capable of reciprocating a predetermined distance dl in the illustrated direction with reference to the second structure 220.

According to various embodiments, a first plate 211 of the first structure 210 may include a first face 211*a* and a second face 211*b* facing away from the first face 211*a*. According to an embodiment, the second structure 220 may include a second plate 221, a first sidewall 221*a* extending from the second plate 221, a second sidewall 221*b* extending from the second plate 221, a third sidewall 221*c* extending from the first sidewall 221*b* and the second plate 221 and parallel to the second sidewall 221*b*, or a second rear plate 280 (e.g., a rear window). According to an embodiment, the second plate 221, the first sidewall 221*a*, the second sidewall 221*b*, and the third sidewall 221*c* may be formed to be opened at one side so as to accommodate at least a portion of the first structure 210. According to an embodiment, the second sidewall 221*b* or the third sidewall 221*c* may be omitted. According to an embodiment, the second plate 221, the first sidewall 221*a*, the second sidewall 221*b*, or the third sidewall 221*c* may be formed as an integrated structure. As another example, the second plate 221, the first sidewall 221*a*, the second sidewall 221*b*, or the third sidewall 221*c* may be formed as separate structures and may then be coupled to each other. According to an embodiment, the second rear plate 280 may cover at least a portion of the display 212.

According to an embodiment, the first structure 210 is movable to an opened state or a closed state relative to the second structure 220 in a first direction (e.g., direction ①) parallel to the second plate 221 and the second sidewall 221*b*, so that the first structure 210 may be located at a first distance from the first sidewall 221*a* in the closed state and at a second distance, which is greater than the first distance, from the first sidewall 221*a* in the opened state.

According to an embodiment, the electronic device 200 may include at least one of a display 212, audio modules 213 and 223, camera modules 215 and 235, an indicator 216 (e.g., an LED device), sensor modules 214 and 234, a key input device 227, or connector holes 231 and 232.

According to an embodiment, the display 212 may extend across at least a portion of the first face 211*a*, and may include a planar portion 212*a* disposed on the first face 211*a* and a bendable portion extending from the planar portion 212*a* to a space between the first sidewall 211*a* and the first structure 210 in the closed state. According to an embodiment, when viewed from above the first plate 211, at least a portion of the bendable portion of the display may be configured to move by a predetermined display area EA toward the planar portion in order to form a substantially planar face between the planar portion 212*a* and the first sidewall 221*a* when the first structure 210 moves from the closed state to the opened state. The display 212 may be coupled to or disposed adjacent to a touch-sensing circuit, a pressure sensor capable of measuring touch intensity (pressure), and/or a digitizer that detects a magnetic-field-type stylus pen.

According to an embodiment, the audio modules 213, 223, and 225 may include speaker holes 213 and 223 or a microphone hole 225. The speaker holes 213 and 223 may include a receiver hole 213 or an external speaker hole 223. The microphone hole 225 may include a microphone disposed therein so as to acquire external sound, and in some embodiments, the microphone hole 225 may include multiple microphones disposed therein so as to sense the direction of sound. In some embodiments, the speaker holes 213 and 223 and the microphone hole 225 may be implemented as a single hole, or a speaker may be included without speaker holes 213 and 223 (e.g., a piezo speaker). According to an embodiment, the receiver hole 213 may be disposed in the first structure 210, and the external speaker hole 223 or the microphone hole 225 may be disposed in the second structure 220. According to another embodiment, the external speaker hole 223 may be disposed in the second face 211*b* of the first plate 211 or in the side face of the first structure 210. According to another embodiment, the microphone hole 225 may be disposed in the side face of the first structure 210.

According to an embodiment, the sensor modules 214 and 234 may generate an electrical signal or a data value corresponding to the internal operating state of the electronic device 200 or an external environmental state. The sensor modules 214 and 234 may include, for example, a first sensor module 214 (e.g., a proximity sensor) disposed on the first face 211*a* of the first plate 211, a second sensor module (not illustrated) (e.g., a fingerprint sensor) disposed on the second face 211*b* of the first plate 211, and/or a third sensor module 234 (e.g., an HIRM sensor). The electronic device 200 may further include at least one of sensor modules (not illustrated in the drawings), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 215 and 235 may include a first camera device 215 disposed on the first face 211*a* of the first plate 211 and a second camera device 235 disposed on the second face 211*b*. The first camera device 215 or the second camera device 235 may include one or more lenses, an image sensor, and/or an image signal processor. According to an embodiment, the second camera device 235 may be disposed on one face of the second structure 220.

According to an embodiment, the key input device 227 may be disposed on the second sidewall 221*b* or the third sidewall 221*c* of the second structure 220. The electronic device 200 may include a key input device (not illustrated), such as a home key button or touch pads disposed around the home key button. According to another embodiment, at least a portion of the key input device 227 may be located in one area of the first structure 210.

According to an embodiment, the indicator 216 may be disposed on the first face 211*a* of the first plate 211. The indicator 216 may include an LED, for example, as long as it can provide the state information of the electronic device 200 in an optical form.

According to an embodiment, the connector holes 231 and 232 may include a first connector hole 231 capable of accommodating a connector (e.g., a USB connector) for transmitting/receiving power and/or data to/from an external electronic device, and/or a second connector hole 232 capable of accommodating a connector (or, an earphone jack) for transmitting/receiving an audio signal to/from an external electronic device. According to an embodiment, the first connector hole 231 or the second connector hole 232 may be disposed in the first sidewall 221*a* of the second structure 220. According to another embodiment, the first connector hole 231 or the second connector hole 232 may be formed in the sidewall of the first structure 210.

FIG. 3 is an exploded perspective view illustrating an electronic device 300 according to various embodiments of the disclosure in a disassembled state. Referring to FIG. 3, the electronic device 300 (e.g., the electronic devices 101, 102, 104, or 200 of FIG. 1 or FIG. 2) may include: a display 303 (e.g., a flexible display), a first structure 302*a* (e.g., a slide housing), a first plate I (e.g., an inner plate), a second structure 301 (e.g., a guide housing), a second plate 313, a circuit board or printed circuit board 304, a first support member 341 (e.g., a rear case), a first rear plate 321 (e.g., a second decorative plate), a first hinge plate 361 (e.g., a first guide member), a roller 365 (e.g., a third guide member), a second hinge plate 363 (e.g., a second guide member), or a second rear plate 311 (e.g., a first decorative plate or a rear window). In some embodiments, in the electronic device 300, at least one of the components (e.g., the support member 341 or the first rear plate 321) may be omitted, or other components may be additionally included.

According to various embodiments, the first structure 302*a*, for example, the slide housing, may be partially accommodated in the second structure 301 by being coupled to the second structure 301 and sliding in the first horizontal direction D1. According to an embodiment, the display 303 has a partial area (hereinafter, referred to as a "first area 303*a*") mounted on the first structure 302*a*, and another partial area (hereinafter, referred to as a "second area 303*b*") capable of being accommodated in the inside of the second structure 301 according to the slide movement of the first structure 302*a*. In the state of being accommodated in the second structure, at least a portion of the second area 303*b* may be located side by side with (e.g., substantially parallel to) a portion of the first area 303*a* in the state of being accommodated in the second structure 301.

According to various embodiments, the display 303 may include a first face S1, a second face S2, and a third face S3, and the exposed area of the display 303 may vary depending on the slide movement of the slide housing, for example, the first structure 302*a*, and the display area of the screen may be changed based on the exposed area. In an embodiment, the first face S1 may form the entire first area 303*a* and a portion of the second area 303*b*, and the second face S2 and the third face S3 may form the remaining portion of the second area 303*b*. The first face S1 and the third face S3 may form a planar face, and the second face S2 may form a curved face.

According to various embodiments, the display 303 may include, for example, an organic light-emitting diode, and may have a thickness that is small enough to be foldable or rollable. For example, the display 303 is substantially flexible in the entire area thereof, and thus is capable of outputting a screen even in the state of being folded or rolled within a range in which a predetermined radius of curvature is maintained. According to an embodiment, the first area 303*a* may be attached to the slide housing, for example, the first structure 302*a*, so as to maintain a substantially flat shape, and the second area 303*b* may be partially deformed so as to form a curved shape depending on the slide movement of the first structure 302*a* while retaining the substantially flat shape. According to another embodiment, the first area 303*a* may be substantially attached to the first face F1 of the first plate I (or an inner plate), and the first plate I may be substantially concealed by the display 303 or the first area 303*a*. For example, the first plate I may be hidden by the display 303, and may not be visually exposed to the outside. In some embodiments, the display 303 may be deformed in a curved shape, and, depending on the structure of the electronic device, for example, the first structure 302*a*, or the design of an area attached to the first structure 302*a*, the display 303 may maintain the substantially flat shape.

According to an embodiment, the electronic device 300 may further include, for example, a support plate 305 disposed above or below the rear face of the display 303, for example, between the first area 303*a* and the first structure 302*a* (e.g., the first plate I). In some embodiments, the support plate 305 may form an inner plate, e.g., a portion of the first plate I. In FIG. 3, one face of the first structure 302*a* (e.g., the first face F1, on which the display 303 is mounted)

is shown in a substantially planar shape. However, in actual products, various types of structures (e.g., grooves for arranging an integrated circuit chip or a flexible printed circuit board) may be provided. The support plate 305 is capable of preventing the above-mentioned structure from coming into direct contact or interfering with the display 303, and is capable of ensuring the flatness of the display-mounting area (e.g., the first face F1 in the first plate I).

According to various embodiments, the display 303 may include an inactive area IA for arranging various hardware. According to an embodiment, hardware disposed above (or below) the display 303 (e.g., the inactive area IA) or substantially overlapping the display 303 may include a receiver, a proximity sensor, an illuminance sensor, an image sensor (e.g., the camera module 180 in FIG. 1), and the like. In some embodiments, a sensor that detects optical information, for example, image information, such as a fingerprint sensor or an iris sensor, may be disposed to overlap a screen output area (e.g., an active area) of the display 303. For example, some pieces of hardware of the electronic device 300 may be disposed to overlap the flexible display 303 in an area outside the inactive area IA.

According to an embodiment, the inactive area IA may be formed along the periphery of the display 303 when the display 303 is viewed from the upper side. In some embodiments, the inactive area IA may be formed as an area that does not substantially output a screen, but the disclosure is not limited thereto. For example, when the display 303 is viewed from the front side, substantially the entire area of the display 303 may be formed as an area outputting a screen. According to an embodiment, when an image sensor (e.g., the camera module 180 in FIG. 1) and a sensor module (e.g., the sensor module 176 in FIG. 1), such as a fingerprint sensor or an iris sensor, is disposed to correspond to a partial area of the display 303, the display 303 may include a transparent area in the corresponding area, thereby providing a path for light transmission.

According to various embodiments, a plurality of opening portions 331 and 333 may be disposed in the inactive area IA in order to provide a path for light transmission. Here, the "opening portions" may be, for example, structures that separate a space on the outer face of the display 303 and the space on the inner face of the display 303 from each other while transmitting light therethrough (e.g., the opening portion indicated by reference numeral "333"). In some embodiments, some of the opening portions may be structures that connect the space on the inner face of the display 303 and the space on the outer face of the display 303 while transmitting light therethrough (e.g., the opening indicated by reference numeral "331"). For example, some of the openings (e.g., the opening indicated by reference numeral "331") may include a through hole structure that passes sound therethrough. According to an embodiment, the electronic device 300 may include an electronic component 343 disposed to correspond to one of the opening portions 331 and 333. The electronic component 343 may include a camera sensor, a proximity sensor, or an illuminance sensor that generates a signal or information based on information about incident light. In another embodiment, the electronic component 343 may include a light-emitting device (e.g., a light-emitting diode) that emits light to provide visual information.

According to various embodiments, the first structure 302a may provide a recess R for accommodating a circuit board or the like, for example, an internal space, and the recess R may be at least partially surrounded by a side member (S) of the first structure 302a. According to an embodiment, when viewed from above the display 303, the side member S may be formed to at least partially surround the recess R. In some embodiments, an inner plate, for example, the first plate I, may extend from the side member S, and may be a portion of the first structure 302a. For example, the first plate I may extend substantially integrally with the side member S, and may be provided to surround at least a portion of the recess R together with the side member S. For example, the first plate I has a first face F1 facing away from the recess R, and a second face facing the recess R (e.g., the second face F2 in FIG. 12). The first structure 302a may be formed of, for example, a metal material and/or a non-metal (e.g., polymer) material. According to an embodiment, the display 303 is coupled to the first surface F1 of the first plate I and a printed circuit board 304 is provided on the second face, for example, in the recess R. The first plate I may be connected to one side of a support portion, which is at least connected to the second surface S2 of the display 303, for example, a multi-bar assembly 302b. The first structure 302a may slide with respect to the second structure while being guided by the second hinge plate 363.

According to various embodiments, the side member S and the inner plate, for example, the first plate I, may be made of substantially the same material. For example, the side member S and the first plate I may be formed as a single body (integrated body), and may include a metal material. In another embodiment, the first plate I may further include an additional plate (e.g., the support plate 305) made of a material different from that of the side member S.

According to various embodiments of the disclosure, when the second structure 302a slides in a first direction M1 (e.g., the first horizontal direction D1 in FIG. 3), the second area 303b may be exposed to the outside of the guide housing, for example, the second structure 301. For example, when the slide housing 302a slides in the first direction M1, the second area 303b may be positioned to form a substantially planar face with the first area 303a. Compared with the state in which the slide housing 302a is accommodated in the second structure 301, the screen output area (e.g., the exposed area) of the display 303 may be expanded by the movement range E of the slide housing 302a. In another embodiment, the second area 303b may be deformed into a curved shape while being moved between the position where the second area 303b is partially parallel to the first area 303a (e.g., the position where the second area 303b is accommodated in the second structure 301) and the position where the second area 303b forms one planar face with the first area 303b (e.g., a position where the second area 303b is exposed to the outside of the second structure 301).

According to various embodiments, the electronic device 300 may further include a support unit for guiding and supporting the movement of the second area 303b or the deformation of the second area 303b into the curved surface, for example, the multi-bar assembly 302b. According to various embodiments, the multi-bar assembly 302b may suppress the local deformation of the display 303 (e.g., the second area 303b) caused by a user's touch (e.g., touch input) while guiding the movement of the second area 303b or the deformation of the second area 303b into the curved shape.

According to various embodiments, the first structure 302a may be coupled to the second structure 301, and may partially slide in the first direction M1 from a position where the first structure 302a is accommodated in the second structure 301. The circuit board 304 (e.g., a main circuit board or an auxiliary circuit board), a battery (not illustrated), or the like may be built in the first structure 302a (e.g., the recess R), and the first support member 341 (e.g., a bracket) may be mounted inside the first structure 302a to mount or fix built-in components or to provide an electromagnetic shielding structure between the built-in components. For example, on the circuit board 304, various electronic components, such as a processor (e.g., the processor 120 in FIG. 1), memory (e.g., the memory 130 in FIG. 1), various sensor modules (e.g., the sensor module 176 in FIG. 1), a power management module (e.g., the power management module 188 of FIG. 1), and a communication module (e.g., the communication module 190 in FIG. 1), may be mounted, the support member may take the form of an integrated circuit chip, and a control circuit may block electromagnetic interference between electronic components mounted on the circuit board 304.

According to various embodiments, the slide housing 302a, for example, the second structure, may further include a second rear plate 321 (e.g., a second decorative plate). For example, the second rear plate 321 is substantially located on the exterior of the slide housing 302a, and may be made of various materials such as metal, glass, ceramic, or a polymer (or combinations of these materials) in various shapes. In the case where the second decorative plate 321 is formed of a polymer, a plurality of polymer layers having different colors and textures may be stacked so as to form the second decorative plate 321.

According to various embodiments, the electronic device 300 may include first and second hinge plates 361 and 363 (e.g., first and second guide members) that guide the movement of the first structure 302a. Each of the first hinge plate 361 and the second hinge plate 363 is mounted and fixed in the second structure 301, and may include guide ribs 361a or 363a, for example, hinge plate fixing portions, provided at the opposite side ends thereof. Although not illustrated, guide grooves extending in the first direction M1 may be formed in the inner wall of the first structure 302a, and the guide ribs or hinge plate fixing portions 361a and 363a may be engaged with the guide grooves in the first structure so as to guide the slide movement of the first structure 302a. For example, the first structure 302a may slide with respect to the first structure 301 while being guided by a structure surrounded the second structure 301 or a structure implemented by the guide ribs or hinge plate fixing portions 361a and 363a.

According to various embodiments, the first hinge plate 361 may support the support portion, for example, the multi-bar assembly 302b, when the display 303 is expanded. In an embodiment, the first hinge plate 361 and the first hinge plate fixing portion 361a may be integrally formed. The first hinge plate fixing portion 361a may be connected to the second hinge plate fixing portion 363a of the second hinge plate 363.

According to various embodiments, a third guide member, for example, the roller 365, may guide the multi-bar assembly 302b to be deformed into a curved shape, and when the multi-bar assembly 302b is deformed into a curved shape, the third guide member may maintain or support the radius of curvature of the multi-bar assembly 302b to some extent. The roller 365 may be rotated depending on the movement of the multi-bar assembly 302b or the movement of the first structure 302a in the state of being connected to the second hinge plate fixing portion 363a or the first hinge plate 361.

According to various embodiments, a support portion, for example, the multi-bar assembly 302b, may include a plurality of linear bars (e.g., rods or bars 429 in FIG. 4 to be described later) extending or disposed in a second horizontal direction (e.g., the second horizontal direction D2 in FIG. 3). A plurality of linear bars may be arranged or connected in the moving direction of the slide housing 302a (e.g., the first horizontal direction D1 in FIG. 3), and thus the multi-bar assembly 302b may be formed as a flat plate deformable into a curved shape. The multi-bar assembly 302b may support at least a portion of the second face S2 of the display 303. One side of the multi-bar assembly 302b may be connected to the first structure 302a, and when the first structure 302a slides, may maintain the flat shape by being supported by the first hinge plate 361 or the second hinge plate 363 inside the second structure 301. In another embodiment, the rods or bars extend in a direction substantially perpendicular to the first direction M1, and are arranged adjacent to each other along the first direction M1 to form the multi-bar assembly 302b. According to some embodiments, the second area 303b may be substantially attached to the multi-bar assembly 302b (e.g., a support portion), and may be accommodated in the inside of the second structure 301 or exposed to the outside the first structure 301 together with the multi-bar assembly 302b.

According to various embodiments, while the support portion, for example, the multi-bar assembly 302b, is accommodated in the inside of the second structure 301 or slides to the outside of the second structure 301, the third guide member (e.g., the roller 365) may maintain the curvature of the second area 303b, for example, the second surface S2 to some extent. According to an embodiment, the roller 365 may be mounted inside the guide housing 301 in the state in which the roller 365 is substantially perpendicular to the first direction M1. The multi-bar assembly 302b may move along a path bypassing the roller 365 (e.g., while maintaining a shape surrounding at least a portion of the roller 365). For example, the support portion 302b or the display 303 (e.g., the second area 303b) may move to the inside of the second structure 301 or the outside of the second structure 301 through a gap or a space between the inner wall of the second structure 301 and the third guide member, for example, the roller 365. In some embodiments, the roller 365 has a rod shape having a substantially circular cross section, and may rotate to correspond to the movement of the multi-bar assembly 302b. For example, the roller 365 is rotatably mounted on the second structure 301, and may rotate to correspond to the movement of the multi-bar assembly 302b or the second area 303b so as to suppress or alleviate the occurrence of friction or noise.

According to various embodiments, the second hinge plate 363 may support the third face S3 of the display 303. The second hinge plate 363 may be fixed inside the second structure 301, and the second hinge plate fixing portion 363a may be used to guide the slide movement of the first structure 302a. In the second structure 301, the second hinge plate 363 may maintain or support the multi-bar assembly 302b or the second surface S2 in the form of a flat plate. The second hinge plate 363 may be formed as a component separate from the second hinge plate fixing portion 363a.

According to various embodiments, the second structure 301 may be formed to surround at least a portion of the first structure 302a, the second hinge plate 363, the multi-bar assembly 302b, and the like. For example, the second structure 301 may guide the slide movement of the first structure 302a, and may have a shape that provides a space for accommodating the second area 303b. According to an embodiment, the second structure 301 may include a second plate 313, a first sidewall 321a extending from the second plate 313, a second sidewall 321b extending from the first sidewall 321a and the second plate 313, and a third sidewall 321c extending from the first sidewall 321a and the second plate 313 and parallel to the second sidewall 321b. The second structure 301 may form a space that is capable of accommodating components such as an antenna in a space that does not overlap the multi-bar assembly 302b. The second structure 301 may include a second rear plate 311 (e.g., the first decorative plate or the rear window) that covers at least a portion of the third face S3 of the display 303.

According to various embodiments, the second rear plate 311 may include a material that does not transmit light when it is not necessary to display information on the third face S3 of the display 303. For example, the second rear plate 311 is substantially located on the exterior of the second structure 301, and may be made of various materials such as metal, glass, ceramic, or polymer (or combinations of these materials) in various shapes. In the case where the second rear plate 311 is formed of a polymer, a plurality of polymer layers having different colors and textures may be stacked so as to form the second rear plate 311. As another example, the second rear plate 311 may be formed of a material that transmits light so as to display information on the third face S3 of the display 303. The second rear plate 311 may be formed integrally with the second structure 301.

According to various embodiments, the support member 341 may be disposed between the circuit board 304 and the first rear plate 321.

Figure 4:
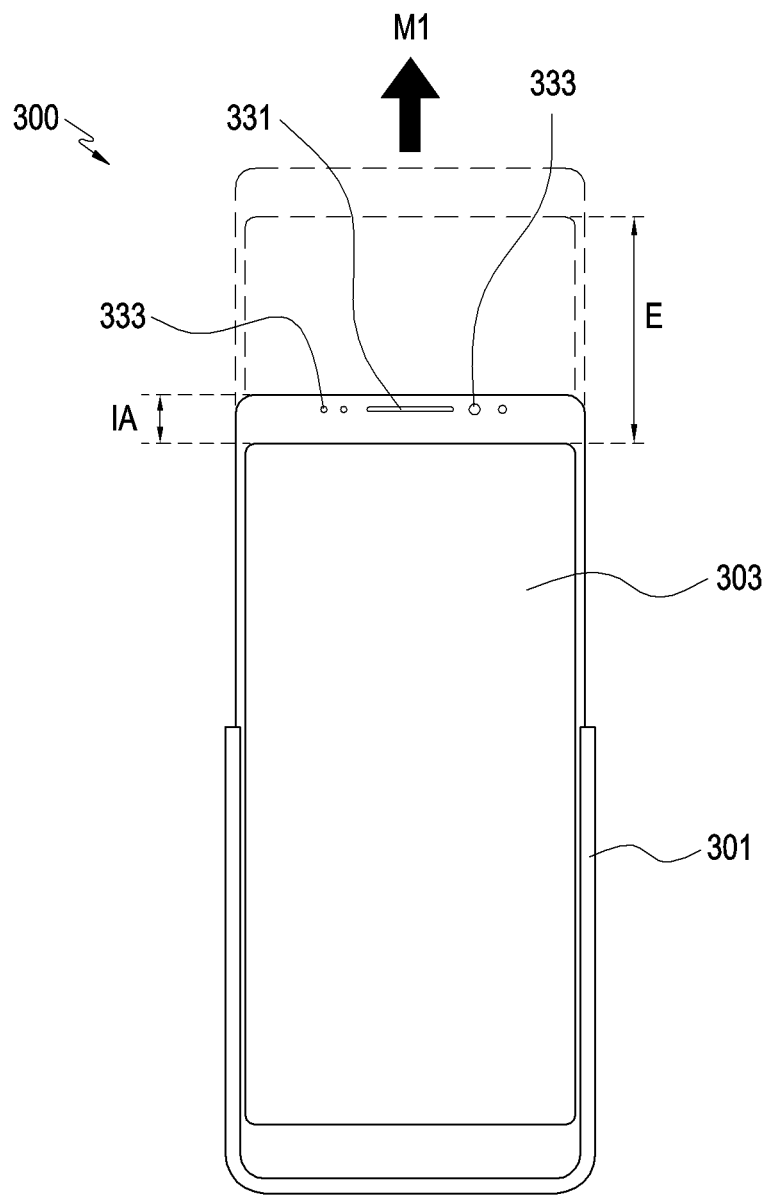
FIG. 4 is a front view illustrating an electronic device according to various embodiments of the disclosure.
Figure 5:
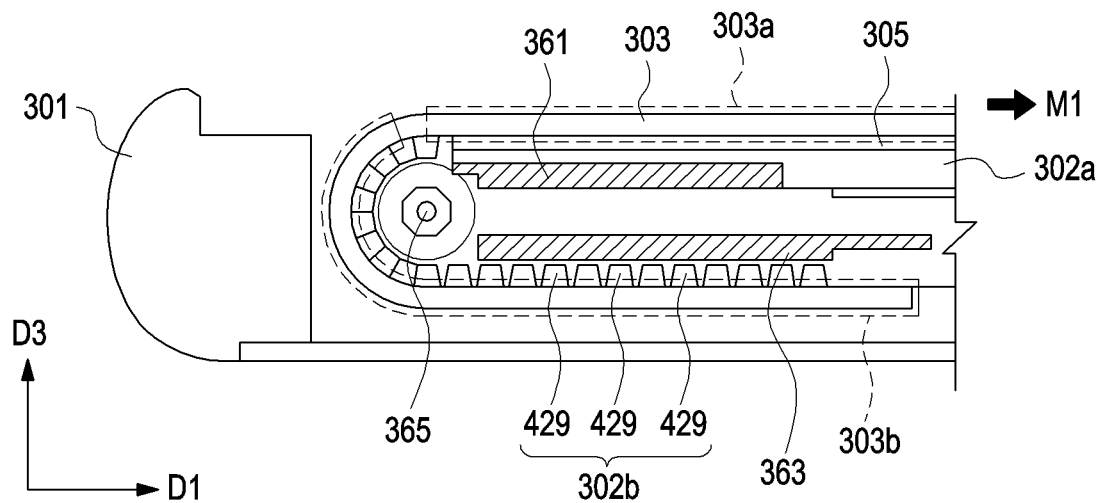
FIGS. 5 and 6 are cross-sectional views for describing the operation of an electronic device according to various embodiments of the disclosure.
Figure 6:
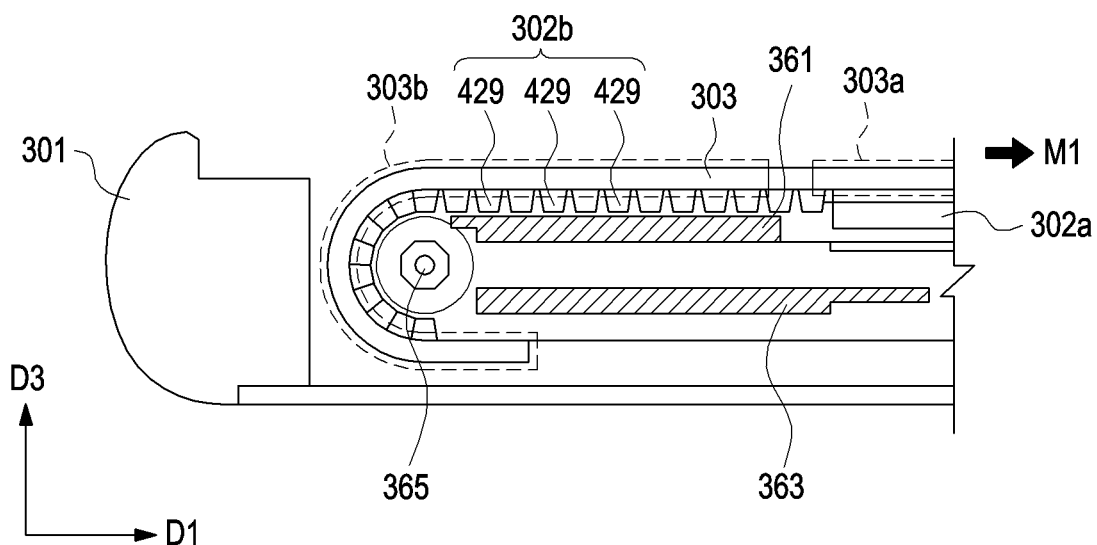

FIGS. 5 and 6 are cross-sectional views for describing the operation of an electronic device (e.g., the electronic device 300 in FIG. 3 or FIG. 4) according to various embodiments of the disclosure.

Further referring to FIGS. 5 and 6, a portion (e.g., the first area 303a) of a flexible display, for example, the display 303 in FIG. 3, may be mounted on the slide housing, for example, the first structure 302a, and another portion (e.g., the second area 303b) may be mounted on the support portion, for example, the multi-bar assembly 302b in FIG. 3. In an embodiment, the support plate 305 may be mounted between the flexible display 303 and the slide housing 302a. In another embodiment, the support portion, e.g., the multi-bar assembly 302b, has a structure including a plurality of rods or bars 429 arranged adjacent to each other along the moving direction of the slide housing 302a (e.g., the first direction M1) or along the direction opposite the moving direction, and is deformable into a curved line (curved face) shape in the space between at least the guide housing, for example, the inner wall of the second structure 301 in FIG. 3, and the third guide member (e.g., the roller 365 in FIG. 3). According to one embodiment, since one end of the support portion 302b is connected to the slide housing 302a, when the slide housing 302a slides, the support portion 302b may bypass the third guide member 365 so as to be accommodated inside the guide housing 301 or to move outside the guide housing 301. For example, while the slide housing 302a slides, the support portion 302b may be deformed into a shape forming a curved line (or curved face) that bypasses the third guide member 365. In some embodiments, in the state in which the multi-bar assembly 302b is accommodated in the slide housing 302a or is moved out of the guide housing 301, any one of the hinge plates 361 and 363 may hold or support the multi-bar assembly 302b in the form of a flat plate.

According to various embodiments, in the state of being accommodated in the guide housing 301, a portion of the flexible display 303 (e.g., the second area 303b) may be located substantially parallel with another portion of the flexible display 303 (e.g., the first area 303a). According to various embodiments, in the state of being exposed to the outside of the guide housing 301, a portion of the flexible display 303 (e.g., the second area 303b) may form one substantially planar face with another portion of the flexible display 303 (e.g., the first area 303a). In another embodiment, regardless of whether the guide housing 301 is accommodated, a certain portion of the flexible display 303 may maintain a curved shape around the third guide member 365.

Figure 7:
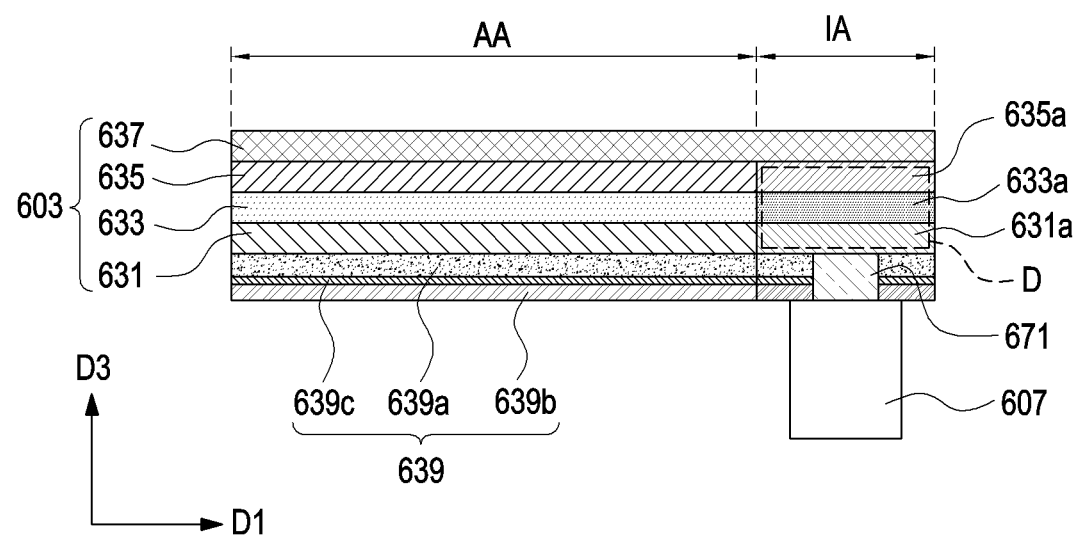
FIG. 7 is a cross-sectional view for describing a flexible display of an electronic device according to various embodiments of the disclosure.

FIG. 7 is a cross-sectional view for describing a flexible display 603 of an electronic device according to various embodiments of the disclosure.

Referring to FIG. 7, the flexible display 603 (e.g., the display 303 in FIG. 3) of an electronic device according to various embodiments of the disclosure includes a light-emitting layer 631, a polarization layer 633, and a touch screen panel 635. According to an embodiment, the flexible display 603 may further include a window 637 or a protective layer 639 so as to protect the light-emitting layer 631.

According to various embodiments, the flexible display 603 may include a transparent area D in a portion thereof, and a sensor 607 (e.g., an image sensor, a fingerprint sensor, or an iris sensor) may be disposed to face the rear face of the flexible display 603. Here, the "transparent area" may be an area that transmits light. According to an embodiment, the "transparent area" in the light-emitting layer that outputs light, for example, an image, may transmit light even while outputting an image, and the corresponding area may generate substantially no light in order to increase light transmission efficiency. For example, during a time period in which high transmission efficiency is required, the corresponding area of the light-emitting layer (e.g., the "transparent area") may be temporarily turned off. For example, in describing various embodiments of the disclosure, the "transparent area" may be described as an area in which a light-emitting material is not included in the light-emitting layer, but this disclosure is not limited thereto.

In some embodiments, the transparent area D may correspond to one of the opening portions in FIG. 3 or FIG. 4 (e.g., the opening portion indicated by reference numeral "333"). For example, together with the opening portion, the transparent area D may allow light to enter the flexible display 603 or may allow light generated inside the flexible display 603 to be emitted to the outside.

According to various embodiments, the sensor 607 may be mounted directly on the rear face of the flexible display 603, and in some embodiments, may be mounted on the inner plate I or the support plate 205. For example, the inner plate I or the support plate 305 may at least partially accommodate the sensor 607 by including a first opening portion (e.g., the first opening portion 329 in FIG. 3), and the sensor 607 may be mounted on the flexible display 607 to correspond to the transparent area D. In another embodiment, the sensor 607 may be mounted on the inner plate I or the support plate 305 in the vicinity of the first opening portion 329. The mounting structure of the sensor will be described in more detail with reference to FIG. 12 and the like.

According to an embodiment, an electronic device (e.g., the electronic device 300 in FIG. 3) detects information about light incident through the transparent area D through the sensor 607, and a processor (e.g., the processor 120 in FIG. 1) may generate an image based on the detected light information. For example, the processor may be an image signal processor, or may at least include an image signal processor, and may acquire a subject image from information detected through the sensor 607. In another embodiment, such a processor (or an image signal processor) may be mounted on the sensor 607 itself. According to various embodiments, the sensor 607 may be a sensor that detects an operating environment of an electronic device, such as a proximity sensor or an illuminance sensor. In another embodiment, a light-emitting device or the like may be disposed on the rear face of the flexible display 603 to correspond to the transparent area D, and may thus display information about the operating state of the electronic device (e.g., a charging state or whether or not a message is received), for example, in color.

According to various embodiments, the flexible display 603 may include a light-emitting layer 631, and the light-emitting layer 631 may include a first transparent area 631a, which transmits light in an area corresponding to the sensor 607. In an embodiment, the light-emitting layer 631 may include an organic light-emitting diode, and may be manufactured to have a considerably small thickness. For example, the light-emitting layer 631, for example, the flexible display 603, may be freely deformable into a curved shape within the range in which a radius of curvature is secured to some extent. The first transparent area 631a may be, for example, a portion of the transparent area D. The light-emitting layer 631 may include, for example, an organic light-emitting material layer encapsulated between transparent substrates. The light-emitting layer 631 may receive a control signal through an electrode layer provided on a transparent substrate, and may output text, images, or video in at least a partial area thereof (e.g., the area indicated by reference numeral "AA(active area)").

The first transparent area 631a will be further described with reference to FIGS. 8 and 9. In the detailed description made with reference to FIGS. 8 and 9, a transparent area (e.g., the first transparent area 631a) formed in the light-emitting layer will be described, and similar to the structure or position of formation of the first transparent area 631a, a transparent area (e.g., a second or third transparent area 633a or 633b to be described later) may also be formed on the polarization layer 633 or the touch screen panel 635 to be described later.

Figures 8, 9:
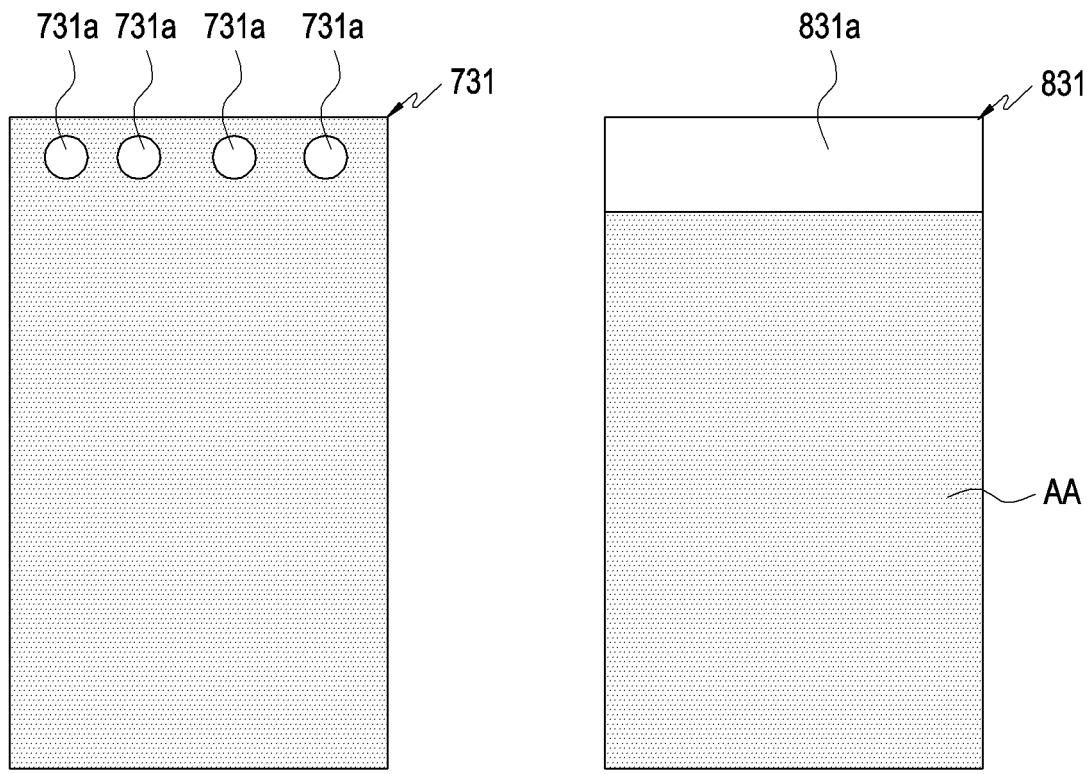
FIGS. 8 and 9 are views each for describing a light-emitting layer of a flexible display according to various embodiments of the disclosure.

FIGS. 8 and 9 are views each for describing a light-emitting layer of a flexible display according to various embodiments of the disclosure.

Further referring to FIGS. 8 and 9, the light-emitting layers 731 and 831 (e.g., the light-emitting layer 631 in FIG. 7) may include a plurality of first transparent areas 731a arranged in the upper edge (e.g., the area corresponding to the area indicated by "IA" in FIG. 7), or a portion of the upper edge portion may be provided as a dummy area 831a that does not emit light. For example, the light-emitting layer 831 of FIG. 9 may be generally formed as an active area AA composed of pixels for emitting light, and may include a dummy area 831a composed of pixels that do not emit light on one side of the active area AA. The first transparent area or the dummy areas 731a and 831a may be formed to correspond to some of the opening portions (e.g., the opening portions indicated by reference numeral "333" in FIG. 3). For example, in a specific embodiment of the disclosure, even though referred to as "light-emitting layers", the light-emitting layers 731 and 831 may include transparent areas (e.g., the first transparent areas or dummy areas 731a and 831a), which do not generate light, and the first transparent areas or the dummy areas 731a and 831a may be aligned with at least some of the opening portions 333 to transmit light. For example, the first transparent areas or dummy areas 731a and 831a may be portions of the light-emitting layers 731 and 831 in which no organic light-emitting material is distributed. For example, pixels for emitting light may not be formed in the first transparent area or the dummy areas 731a and 831a, and pixels may be formed in other areas around the first transparent area or the dummy areas 731a and 831a. In an embodiment, the first transparent area or the dummy regions 731a and 831a may be provided as empty spaces between transparent substrates encapsulating an organic light-emitting layer, or may be filled with a refractive index compensation material so as to compensate for the difference in refractive index occurring at the boundary between two material layers (e.g., the interfaces between the transparent substrates and the empty spaces). In some embodiments, the dummy area 831a may be provided as at least a portion of the first transparent area (e.g., the first transparent area 631a in FIG. 7), which transmits light.

Referring back to FIG. 7, the flexible display 603 may protect the light-emitting layer 631 by including a window member, for example, a window 637 (e.g., a window film). For example, the window 637 may be stacked on the outer face of the light-emitting layer 631 (or may form the outer face of the flexible display 603) to protect the light-emitting layer 631 from the external environment, and may be made of a flexible and substantially transparent layer to transmit a screen output from the light-emitting layer 631, to the outside. According to an embodiment, the transparent layer, for example, the window 637, may be made of a polymeric material, such as polyimide, polycarbonate, polyether sulfone, polyethylene terephthalate, polyethylene naphthalate, polyacrylate, or fiber-reinforced plastic, and may be manufactured to have a thickness of 0.05 mm to 0.2 mm, for example, 0.15 mm or less, to be deformed into a curved shape together with the light-emitting layer 631. For example, in the operation of being accommodated inside the second structure of the guide housing 301 in FIG. 3 or exposed to the outside of the second structure or the guide housing 301, the flexible display 603 may be deformed into a curved shape bypassing, for example, the roller 365 in FIG. 3. The roller 365 may prevent damage to the light-emitting layer 631, cracking of the window 637 (e.g., the window film), or the like by maintaining the radius of curvature of the flexible display 603 at a predetermined value or more while guiding the movement of the flexible display 603.

According to various embodiments, the window 637 may be manufactured to be substantially transparent, and may include a light-shielding layer formed on the periphery thereof. The light-shielding layer will be further described with reference to FIG. 10.

Figure 10:
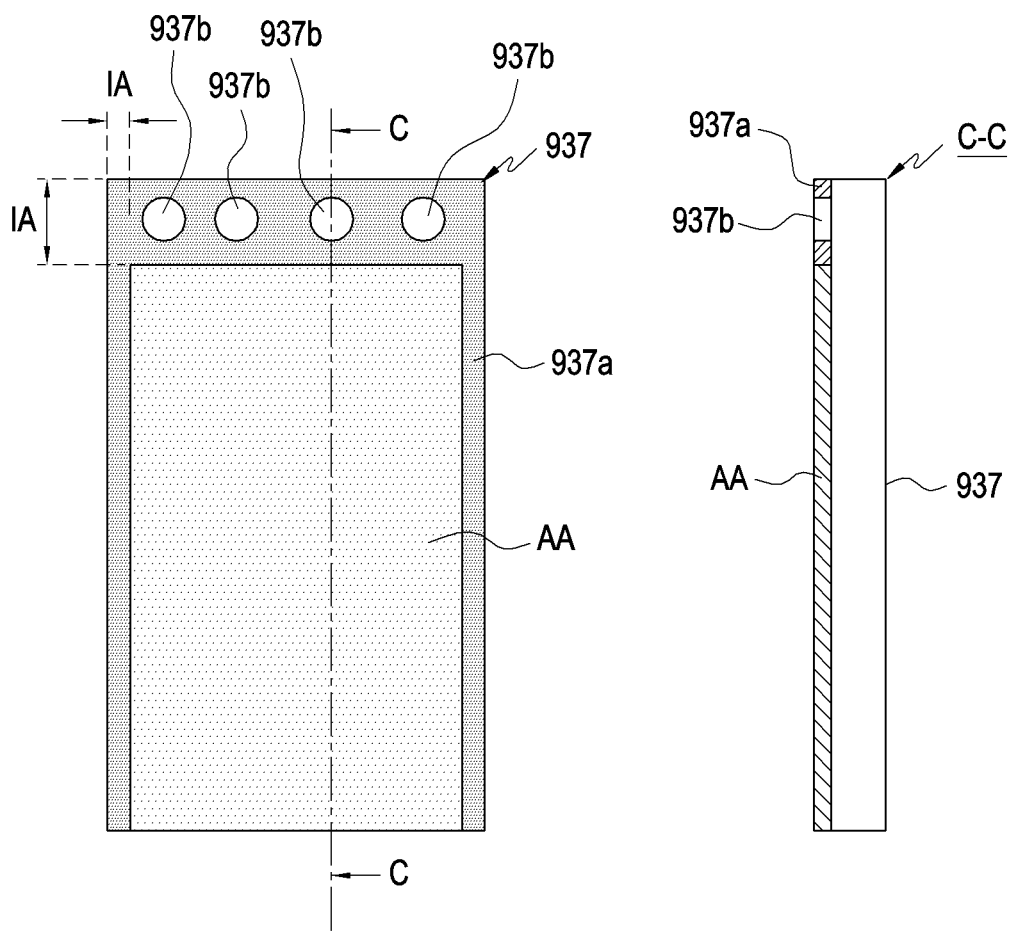
FIG. 10 is a view for describing a window of a flexible display according to various embodiments of the disclosure.

FIG. 10 is a view for describing a window of a flexible display according to various embodiments of the disclosure.

Further referring to FIG. 10, the light-shielding layer 937a may be formed to correspond to at least an area around the first transparent area (e.g., the first transparent area 631a in FIG. 7). In some embodiments, the light-shielding layer 937a may extend substantially along the periphery on the inner face of the window 937 (e.g., the window film), for example, along the periphery of the area for outputting the screen, for example, the active area AA, so as to provide an area in which various electric lines or the like are arranged (e.g., the area indicated by reference number "IA") or to conceal this area. In another embodiment, the flexible display 603 may not include the light-shielding layer 937a, and when viewed from the outside, substantially the entire area may be provided as the area AA for outputting a screen (e.g., see FIG. 11). In an embodiment, the light-shielding layer 937*a* may be formed to correspond to at least an area around the first transparent area 631*a*. For example, the light-shielding layer 937*a* may be formed at the periphery of the window 937, and may be formed to partially overlap the first transparent area 631*a* and to at least partially overlap the area around the first transparent area 731*a* in FIG. 8. In some embodiments, the light-shielding layer 937*a* may include one or more opening portions 937*b* (e.g., the opening portions 233 in FIG. 3), and based on the opening portions 937*b*, an area through which light can pass through the flexible display 603 in a substantially transparent area (e.g., the transparent area D of FIG. 7) may be determined. For example, the opening portions 937*b* may substantially overlap at least the first transparent area 631*a*, or may be aligned with the first transparent area 631*a*, and the opening portions 937*a* may be visually exposed from the exterior of the electronic device (e.g., the electronic device 300 in FIG. 3). According to an embodiment, the opening portions 937*a* have a smaller area than the first transparent area 631*a*, whereby the internal structure of the window 937 (e.g., the window 637 in FIG. 7) can be concealed. In another embodiment, the area through which light can pass may be determined based on the first transparent areas 631*a* and 731*a* or the like.

Referring back to FIG. 7, the flexible display 603 may further include a polarization layer 633 interposed between the light-emitting layer 631 and the window 637. The polarization layer 633 may perform a filter function depending on polarization of light emitted from the light-emitting layer 631, thereby expressing a black color more accurately or controlling color sharpness, image definition or brightness, or the like.

According to various embodiments of the disclosure, the flexible display 603 may include a touch screen panel 635, and may thus be used as an input device (e.g., the input device 150 in FIG. 1) that outputs a screen and detects user input (e.g., touch input or hovering input). In one embodiment, the touch screen panel 635 may include transparent conductive wires or electrodes formed on a transparent film, and may be disposed between the light-emitting layer 631 and the window 637. In some embodiments, the touch screen panel 635 may include transparent conductive wires or electrodes formed on the inner face of the window 637. For example, although the touch screen panel 635 is illustrated in FIG. 7 as a separate layer, this is for convenience of description. Transparent conductive wires or electrodes that implement a touch-screen function may be formed on the inner face of the window 637. In another embodiment, transparent conductive wires or electrodes may be formed on transparent substrates encapsulating the light-emitting layer 631 so as to implement a touch screen panel.

According to various embodiments, the flexible display 603 may further include a second or third transparent area 633*a* or 633*b* formed on the polarization layer 633 or the touch screen panel 635. For example, the touch screen panel 635 may include a second transparent area 635*a*, in which transparent conductive wires or electrodes are not printed in an area corresponding to the first transparent area 631*a* and in which, for example, a sensor for sensing a touch is not formed. The second transparent area 635*a* may be aligned with the first transparent area 631*a*. For example, the second transparent area 635*a* may be disposed between one of the opening portions in FIG. 3 (e.g., one of the opening portions indicated by reference numeral "333") and the first transparent area 631*a*. According to an embodiment, the polarization layer 633 may include a grid pattern for implementing a polarization function, but a pattern that implements a polarization function may not be formed in some areas, for example, in the third transparent area 633*a*. The third transparent area 633*a* may be disposed between one of the opening portions in FIG. 3 (e.g., another one of the opening portions indicated by reference numeral "333") and the first transparent area 631*a*. In some embodiments, the first transparent area 631*a*, the second transparent area 635*a*, or the third transparent area 633*a* may be a portion of the transparent area D, and each of the second transparent area 635*a* and the third transparent area 633*a* may be aligned between one of the opening portions in FIG. 3 (e.g., one of the opening portions indicated by reference numeral "333") and the first transparent area 631*a*.

In describing various embodiments of the disclosure, in the transparent area of each layer (e.g., the first transparent area 731*a* in FIG. 7, the dummy area 831*a* in FIG. 8, or the opening portions 937*b* in FIG. 9), an example in which organic light-emitting materials or the like are not distributed is disclosed. However, as mentioned above, a "transparent area" is an area through which light can be transmitted, and even in a light-emitting layer, the "transparent area" may transmit light while outputting an image even though there is a difference in transmittance. According to an embodiment, the transmittance of the "transparent area" may vary depending on the sensitivity of the sensor that detects information from light passing through the "transparent area". For example, since the amount of light required for operation of the proximity sensor that detects whether it is in close contact with the user's body and the amount of light required for operation of the illuminance sensor that detects the use environment of the electronic device are different from each other, the transmittance of the transparent area corresponding to the proximity sensor and the transmittance of the transparent area corresponding to the illuminance sensor may be different from each other. The transmittance of the "transparent area" described above may be designed or set by adjusting the distribution density of organic light-emitting materials or the like in the transparent area in each layer. In another embodiment, if a light-emitting layer is a structure stacked with a touch panel (e.g., the touch screen panel 635 in FIG. 7) and the like, the transmittance of the "transparent area" described above may be adjusted by adjusting the arrangement of transparent conductive wires or electrodes of the touch panel.

According to various embodiments, in attaching the light-emitting layer 631 and the window 637, or in laminating the polarization layer 633, the touch screen panel 635, or the window 637 on the light-emitting layer 631, an optically clear adhesive may be applied between respective layers so that two adjacent layers can be bonded to each other. In another embodiment, wiring or the like for providing power or a control signal to the light-emitting layer 631, the polarization layer 633, the touch screen panel 635, or the like may be provided as part of the flexible display 603.

According to various embodiments, the flexible display 603 may further include a protective layer 639 disposed on the rear face of the light-emitting layer 631, for example, between the transparent layer (e.g., the window 637) and the inner plate (e.g., the inner plate I in FIG. 3). The protective layer 639 may be a substantially opaque layer, for example, when the flexible display 603 is mounted on an electronic device (e.g., the electronic device 300 in FIG. 3), the protective layer 639 may prevent the flexible display 603 from interfering with other structures of the electronic device 300. The opaque layer, for example, the protective layer 639, may include a cushion layer 639*a* (e.g., sponge) attached to the rear face of the light-emitting layer 631, thereby relieving an impact, pressure, or the like applied to the light-emitting layer 631. For example, the cushion layer 639a may protect the light-emitting layer 631 from an external impact or pressure.

In some embodiments, the protective layer 639 may include a shielding layer formed on the cushion layer 639a in the opposite direction of the light-emitting layer 631, for example, an electromagnetic shielding sheet 639b (e.g., a copper (Cu) sheet or a graphite layer). The shielding sheet 639b makes it possible to block (e.g., reduce) electromagnetic radiation with respect to electronic components therearound. In some embodiments, the protective layer 639 may further include a digitizer 639c that detects touch input in an electromagnetic-resonance or electromagnetic-induction manner. For example, a user may perform a touch or drag input operation on the flexible display 603 having a digitizer embedded therein using a stylus pen having a resonance circuit embedded therein.

According to various embodiments, the flexible display 603 may further include a second opening 671 penetrating the protective layer 639. For example, the second openings 671 may be aligned with the transparent area D, for example, the first transparent area 631a, so as to provide a path to transmit light between the front face of the flexible display 603 and the sensor 607. For example, the sensor 607 may be mounted on the rear face of the flexible display 603 in the state of being aligned with the second opening 671. In some embodiments, the second opening 671 may at least partially overlap the first opening in a vertical direction (e.g., the vertical direction D3 in FIG. 3).

According to various embodiments, since the flexible display 603 is manufactured to be considerably thin enough to be deformable in a curved shape, the user may feel visual or tactile heterogeneity in an area where the second opening 671 is formed. For example, in a narrow area, for example, the "transparent area" described above, the second opening 671 may be exposed in a curved form to the outside, or the user may recognize the curvature by contact. According to various embodiments of the disclosure, a lens (e.g., a lens structure or a polymeric plate), a transparent polymeric material (e.g., a transparent member), or the like may be disposed in a through hole or the second opening 671 formed to correspond to the "transparent area" described above so as to eliminate the above-described visual or tactile heterogeneity. According to an embodiment, a lens or a transparent polymeric material (e.g., a transparent resin) may be disposed or filled in the second opening 671. For example, the lens or the transparent resin may compensate for the reduction in thickness of the flexible display 603 in the area where the second opening 671 is formed. This configuration will be described in more detail with reference to FIG. 16 and the like.

Hereinafter, in describing various embodiments of the disclosure below, components that can be easily understood through the configurations of the preceding embodiments may be denoted by the same reference numerals as in the preceding embodiments, or the reference numerals may be omitted, and detailed descriptions thereof may also be omitted.

Figure 11:
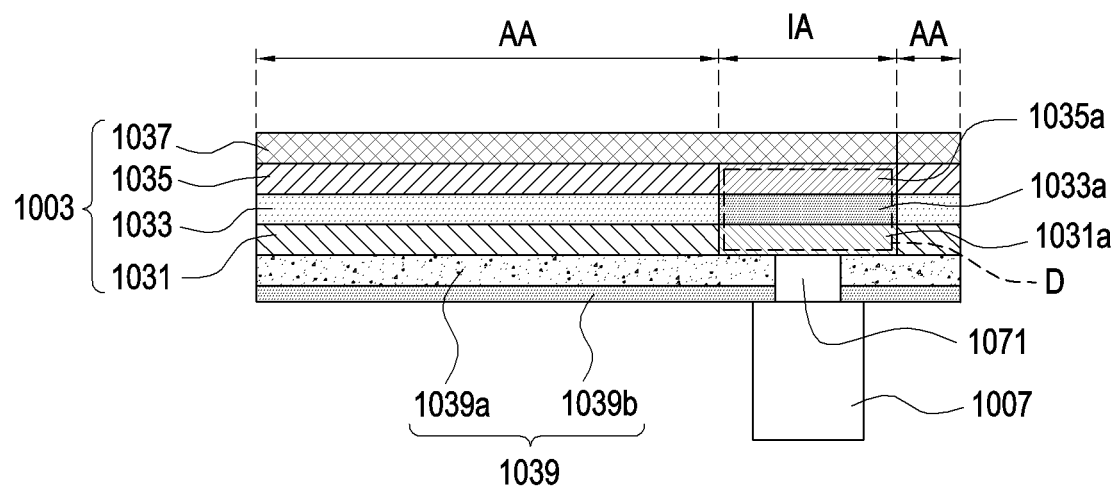
FIG. 11 is a cross-sectional view for describing another exemplary flexible display of an electronic device according to various embodiments of the disclosure.

FIG. 11 is a cross-sectional view for describing another exemplary flexible display of an electronic device according to various embodiments of the disclosure.

Referring to FIG. 11, a flexible display 1003 according to various embodiments of the disclosure may include a light-emitting layer 1031, a polarization layer 1033, a touch screen panel 1035, a window 1037 (e.g., a window film), and a protective layer 1039, and an electronic device (e.g., the electronic device 300 of FIG. 3) may be disposed to face the rear face of the flexible display 1003. In an embodiment, the flexible display 1003 may output a screen in substantially the entire area (e.g., the area indicated by reference number "AA") when viewed from above the flexible display. In some embodiments, the flexible display 1003 may include a transparent area D, which does not output a screen, in a portion corresponding to an area where a sensor 1007 (e.g., the camera module 180 in FIG. 1) is disposed. According to an embodiment, the transparent area D may include a first transparent area 1031a formed in the light-emitting layer 1031, a third transparent area 1035a formed in the polarization layer 1035, or a second transparent area 1033a formed in the touch screen panel 1033. The protective layer 1039 may include an opening 1071 (e.g., the second opening 671 in FIG. 7) corresponding to at least a portion of the transparent area D, and the sensor 1007 may be disposed to correspond to the opening 1071 so as to detect light incident from the outside. As described above, the flexible display 1003 according to various embodiments of the disclosure may not include the above-described light-shielding layer (e.g., the light-shielding layer 937a in FIG. 10), and may output a screen in the entire area thereof, other than the transparent area D.

FIGS. 12 to 15 are cross-sectional views each for describing the state in which a flexible display and a sensor is mounted in an electronic device according to various embodiments of the disclosure.

Figure 12:
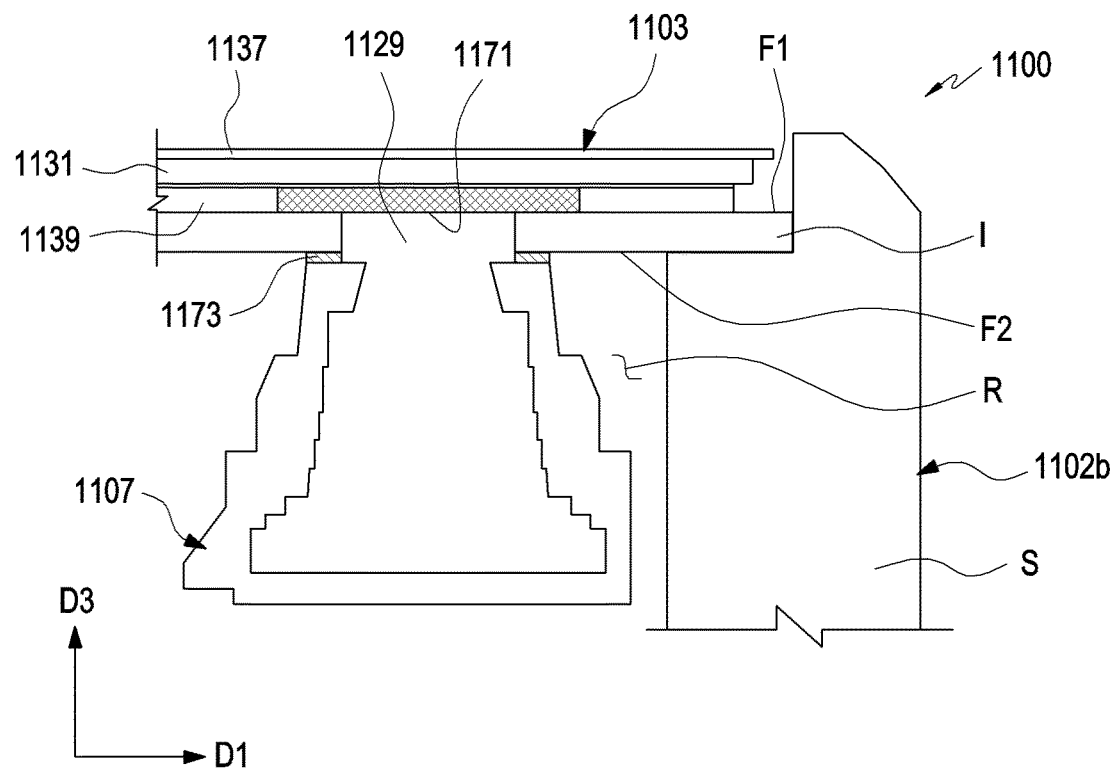
FIGS. 12 to 15 are cross-sectional views each for describing the state in which a flexible display and a sensor are mounted in an electronic device according to various embodiments of the disclosure.

Referring to FIG. 12, an electronic device 1100 (e.g., the electronic device 300 in FIG. 3) may include: a display 1103 mounted on a first face of the inner plate I; and an image sensor 1107 (e.g., the sensor 607 in FIG. 7) disposed inside a housing 1102b (e.g., the first structure or the slide housing 302a in FIG. 3), for example, in the recess R (e.g., the recess R in FIG. 3) and mounted on the inner plate (e.g., the inner plate I in FIG. 3). For example, the image sensor 1107 may be mounted on the second face F2 of the inner plate I via a seating member 1173 in the vicinity of a first opening 1129 (e.g., the first opening 329 in FIG. 3) while being substantially disposed in the recess R.

According to various embodiments, the display 1103 may include a substantially flexible window 1137 (e.g., a window film) and a display panel 1131 bonded to the inner face of the window 1137. According to an embodiment, the display panel 1131 may include the light-emitting layer 631, a polarization plate 633, and a touch screen panel 635, as illustrated in FIG. 7. In another embodiment, the display 1103 may further include a protective layer 1139 (e.g., the protective layer 639 in FIG. 7), thereby protecting the display panel 1131. For example, the display panel 1131 may be disposed between the window 1137 and the protective layer 1139.

According to various embodiments, the image sensor 1107 may be disposed to face a portion of the display 1103 (e.g., the flexible display 603 in FIG. 7) through the first opening 1129 in the inner plate I. For example, the image sensor 1107 may be disposed to correspond to a second opening (e.g., the second opening 671 in FIG. 7) in the display 1103, which is filled with a transparent synthetic resin material 1171 (e.g., a transparent resin). For example, when viewed from above the display 1103, the second opening (e.g., the transparent synthetic resin material 1171) may be disposed to substantially overlap the first opening 1129, and may provide a path that makes light incident on the image sensor 1107.

Figure 13:
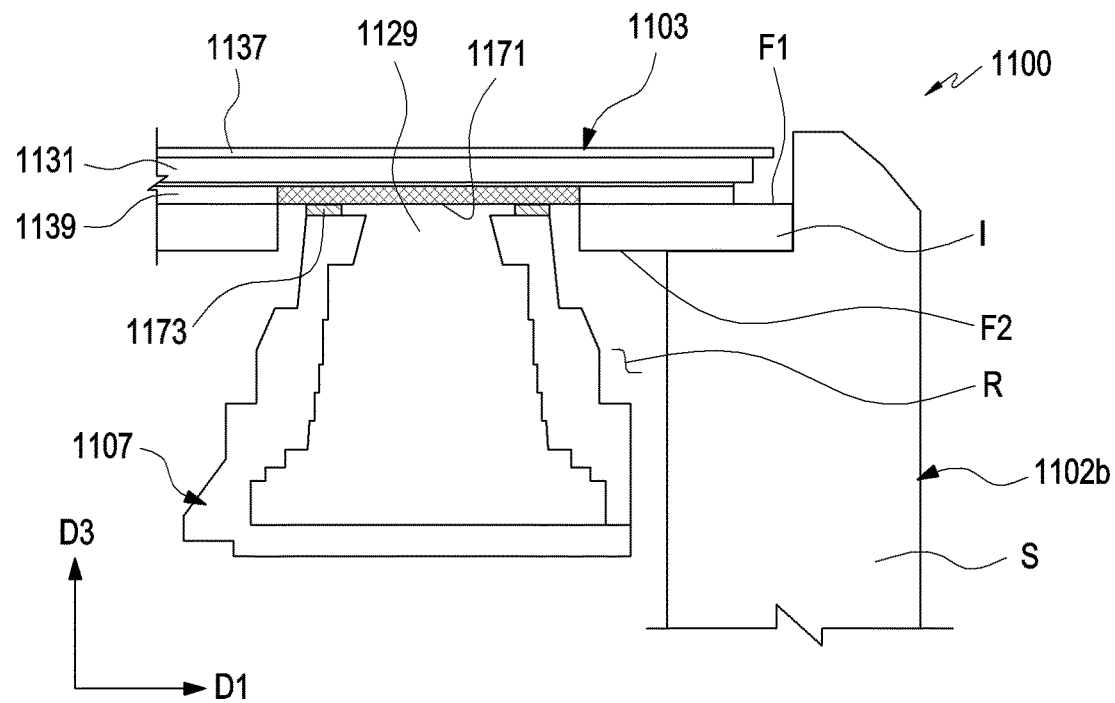

Referring to FIG. 13, the image sensor 1107 may be directly attached to the flexible display 1103 via the seating member 1173 in the state in which at least a portion thereof is accommodated in the first opening 1129. For example, the seating member 1173 is double-sided tape (or sponge) disposed to form a closed curve along the upper end edge of the image sensor 1107, and the image sensor 1107 may be attached to the transparent synthetic resin material 1171 via the seating member 1173.

Figure 14:
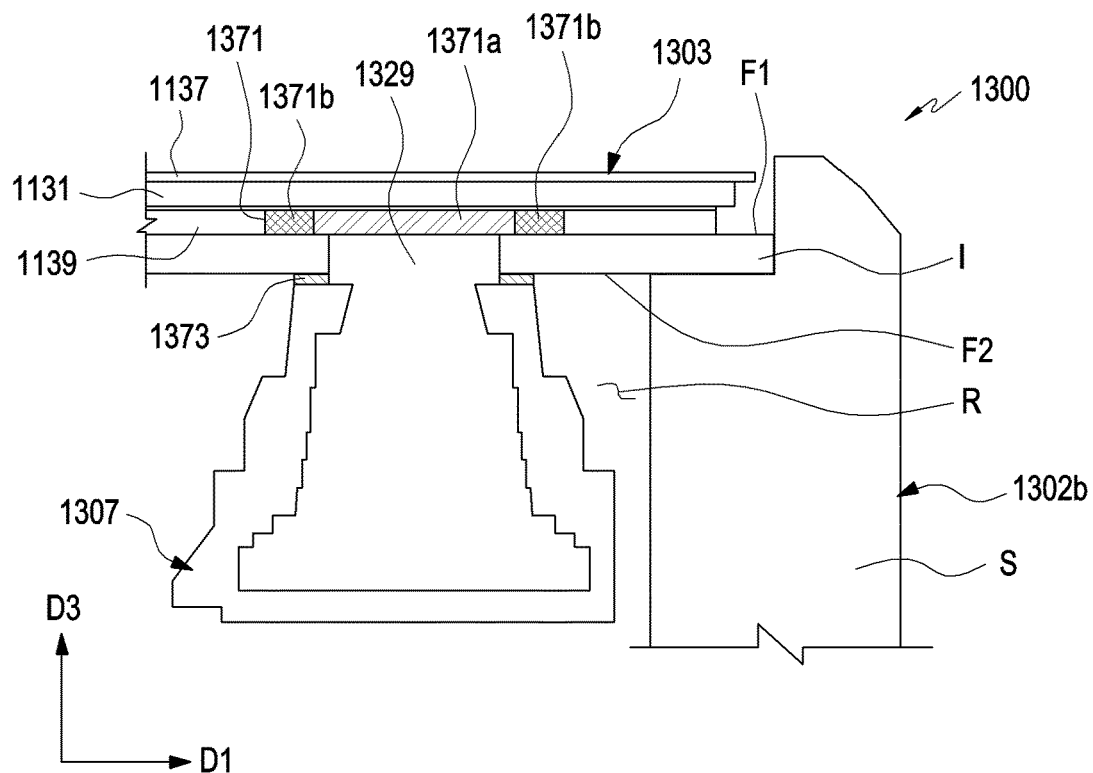

Referring to FIG. 14, an electronic device 1300 (e.g., the electronic device 300 in FIG. 3) may include: a display 1303 mounted on a first face of the inner plate I; and an image sensor 1307 (e.g., the sensor 607 in FIG. 7) disposed inside a housing 1302b (e.g., the first structure or the slide housing 302a in FIG. 3), for example, in the recess R (e.g., the recess R in FIG. 3), and mounted on the inner plate (e.g., the inner plate I in FIG. 3). For example, the image sensor 1307 may be mounted on the second face F2 of the inner plate I via the seating member 1373 in the vicinity of a first opening 1329 while being substantially disposed in the recess R.

According to various embodiments, the display 1303 may include a substantially flexible window 1337 (e.g., a window film) and a display panel 1331 bonded to the inner face of the window 1337. According to an embodiment, the display panel 1331 may include the light-emitting layer 631, a polarization plate 633, and a touch screen panel 635, as illustrated in FIG. 7. In another embodiment, the display 1303 may further include a protective layer 1339 (e.g., the protective layer 639 in FIG. 7), thereby protecting the display panel 1331. For example, the display panel 1331 may be disposed between the window 1337 and the protective layer 1339.

According to various embodiments, the display 1303 (e.g., the flexible display 603 in FIG. 7) may further include a transparent synthetic resin plate accommodated in the second opening 1371 (e.g., the second opening 671 in FIG. 7), for example, a lens 1371. In some embodiments, the lens 1371a may be fixed in the second opening in the display 1303 by a transparent synthetic resin material 1371b (e.g., a transparent resin). The lens 1371a may be combined with a sensor, for example, the image sensor 1307, so as to form a sensor assembly, and the sensor assembly formed by the combination of the sensor and the lens 1371a may be at least partially disposed in the first opening 1329 (see, e.g., FIG. 14).

Figure 15:
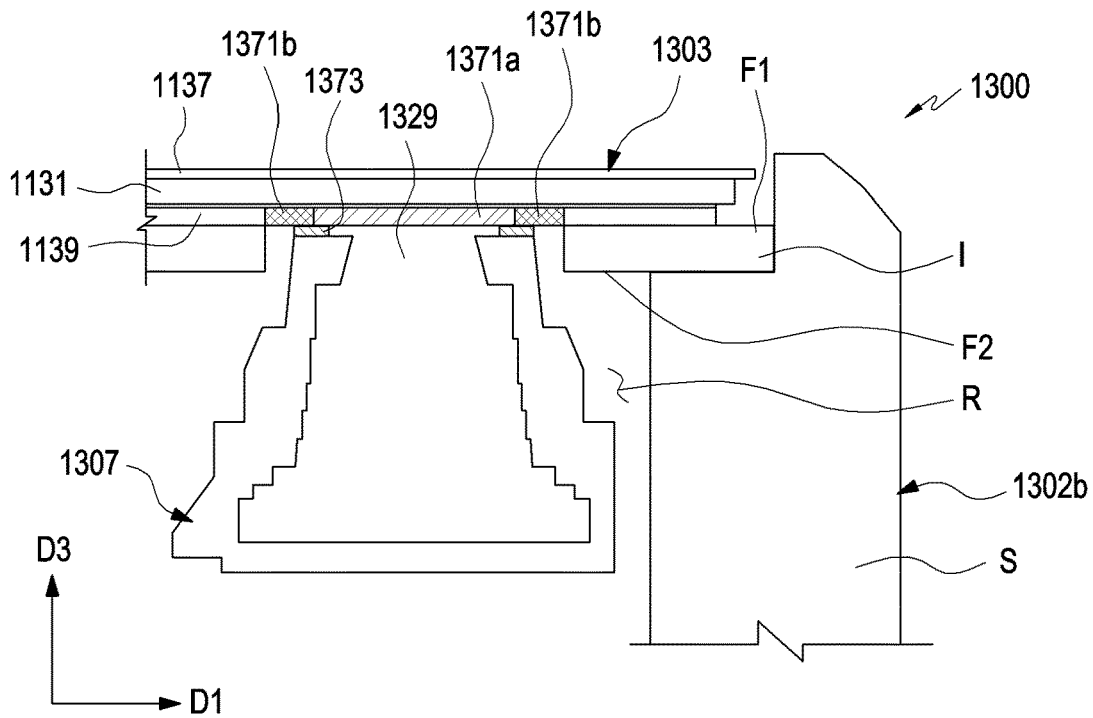

Referring to FIG. 15, the image sensor 1307 may be directly attached to the flexible display 1303 via the seating member 1373 in the state in which at least a portion thereof is accommodated in the first opening 1329. In some embodiments, the lens 1371a may further include a flange portion (e.g., the flange portion 1573 in FIG. 16) extending from the periphery of the area where light is incident, and the seating member 1373 may be attached to the flange portion. In describing various embodiments of the disclosure, the lens 1371a is illustrated as a transparent synthetic resin material, but the disclosure is not limited thereto, and the lens 1371a may be made of other transparent materials such as glass or ceramic. The lens 1371a may be designed to optimize the performance of the image sensor 1307 in consideration of the specifications of the electronic device 1300 and the installation environment of the image sensor 1307. For example, in a path where light passes through the display 1303 and enters the image sensor 1307, the lens 1371a may focus or align light, or may compensate for a difference in refractive index between respective layers (e.g., the display 1303 and the first opening 1329).

Figure 16:
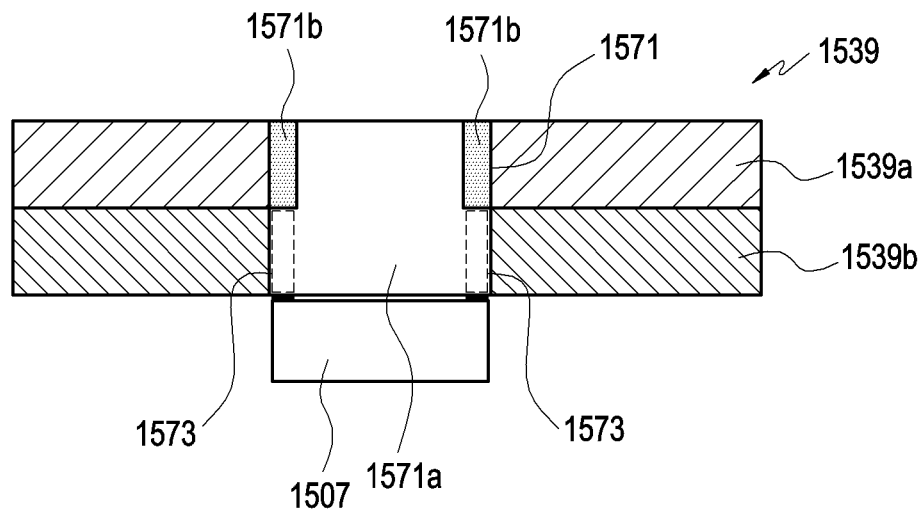
FIG. 16 is a view for describing a modification of a flexible display according to various embodiments of the disclosure.

FIG. 16 is a view for describing a modification of a flexible display according to various embodiments of the disclosure.

Referring to FIG. 16, a transparent polymeric plate disposed in a second opening 1571 within a protective layer 1539 (e.g., a cushion layer 1539a or an electromagnetic shielding layer 1539b) of the display, for example, a lens 1571a (e.g., the lens 1371a in FIG. 15), may include a flange portion 1573. For example, the lens 1571a is a structure for substantially focusing or aligning incident light, and may provide an area, on which light is incident, in the entire area generally facing the outer face of the display (e.g., the display 1303 in FIG. 14). According to an embodiment, the flange portion 1573 may extend from the periphery of the area on which light is incident from the lens 1571a, and the outer face (e.g., the bottom face in FIG. 16) of the lens 1571a, including a portion of the surface of the flange portion 1573, may be substantially coplanar with the inner face of the display, for example, the outer face of the electromagnetic shielding layer 1539b. In some embodiments, a portion of a sensor (e.g., the image sensor 1307 in FIG. 14) may be attached to the flange portion 1573 via a seating member (e.g., the seating member 1373 in FIG. 14). For example, the image sensor or the like may detect light incident through the area surrounded by the flange portion 1573 in the lens 1571a. According to an embodiment, via the flange portion 1573, the lens 1571a may be more stably attached or fixed to the display. For example, the flange portion 1573 may facilitate alignment of the lens 1571a by increasing the area that is in close contact with the inner wall of the second opening 1571. In another embodiment, the flange portion 1573 remains in the state of being in close contact with the inner wall of the second opening 1571. Thus, it is possible to prevent the alignment state of the lens 1571a from being distorted during filling and curing of the transparent synthetic resin material 1571b to be described later and to improve the bonding strength using a synthetic resin material 1571b. In some embodiments, the lens 1571a may be provided as a bonding structure with the sensor 1507 (e.g., the image sensor 1307 in FIG. 14). For example, it is possible to facilitate alignment (e.g., optical axis alignment) of the sensor 1507 with the area on which light is incident from the lens 1571a.

According to various embodiments, a transparent synthetic resin material 1571b (e.g., transparent resin) may fill a gap between the outer peripheral face of the lens 1571a and the inner wall of the second opening 1571. For example, when viewed from above a display (e.g., the display 1303 in FIG. 14), the transparent synthetic resin material 1571b may be disposed to at least partially surround a substantially transparent synthetic resin plate, for example, the lens 1571a.

Figure 17:
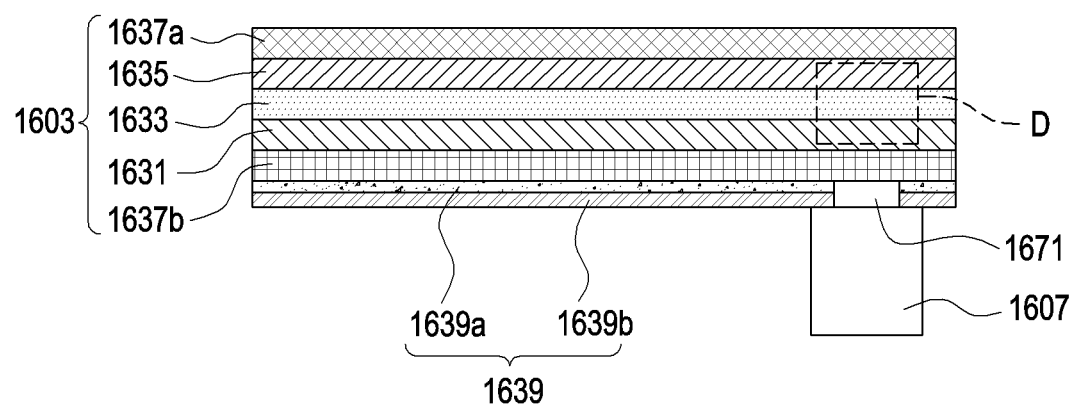
FIG. 17 is a cross-sectional view for describing still another exemplary flexible display of an electronic device according to various embodiments of the disclosure.

FIG. 17 is a cross-sectional view for describing still another exemplary flexible display of an electronic device according to various embodiments of the disclosure.

Referring to FIG. 17, a display 1603 (e.g., the flexible display 603 in FIG. 7) may include a light-emitting layer 1631, and may include a polarization layer 1633, a touch screen panel 1635, or a first window 1637a (e.g., a window film) sequentially laminated in the direction in which a screen implemented by the light-emitting layer 1161 is output. For example, second transparent layers, for example, a second window 1637b (e.g., a window film) and a protective layer 1639, may be sequentially disposed (e.g., laminated) on the inner face side of the light-emitting layer 1631 in the direction opposite the direction in which the screen is output. The second window 1637b may have, for example, a material and thickness, which are the same as the first window 1637a, or a material and thickness, which are different from those of the first window 1637a, and may be disposed to enclose the light-emitting layer 1631 or wires that transmit control signals or power to the light-emitting layer 1631. In an embodiment, a sensor 1607 (e.g., the image sensor 1307 in FIG. 14) may be disposed on the inner face of the display 1603, and a second opening 1671 for providing a path, through which light is incident on the sensor 1607, or the like may be formed in the protective layer 1639. In another embodiment, the second window 1637b may be made of a substantially transparent synthetic resin layer, for example, a polyimide layer, and a separate transparent area or opening may not be formed therein. For example, the second window 1637b may transmit therethrough light incident on the sensor 1607 without loss.

According to an embodiment, the second window 1637b may relieve visual or tactile heterogeneity caused by the second opening 1671. For example, since the second window 1637b is disposed, the display 1603 is capable of maintaining flatness more stably. In some embodiments, if the flatness of the display 1603 can be maintained by disposing the second window 1637b, for example, if visual or tactile heterogeneity can be resolved on the outer face of the display 1603, a lens or a transparent synthetic resin material may not be disposed in the second opening 1671.

Figure 18:
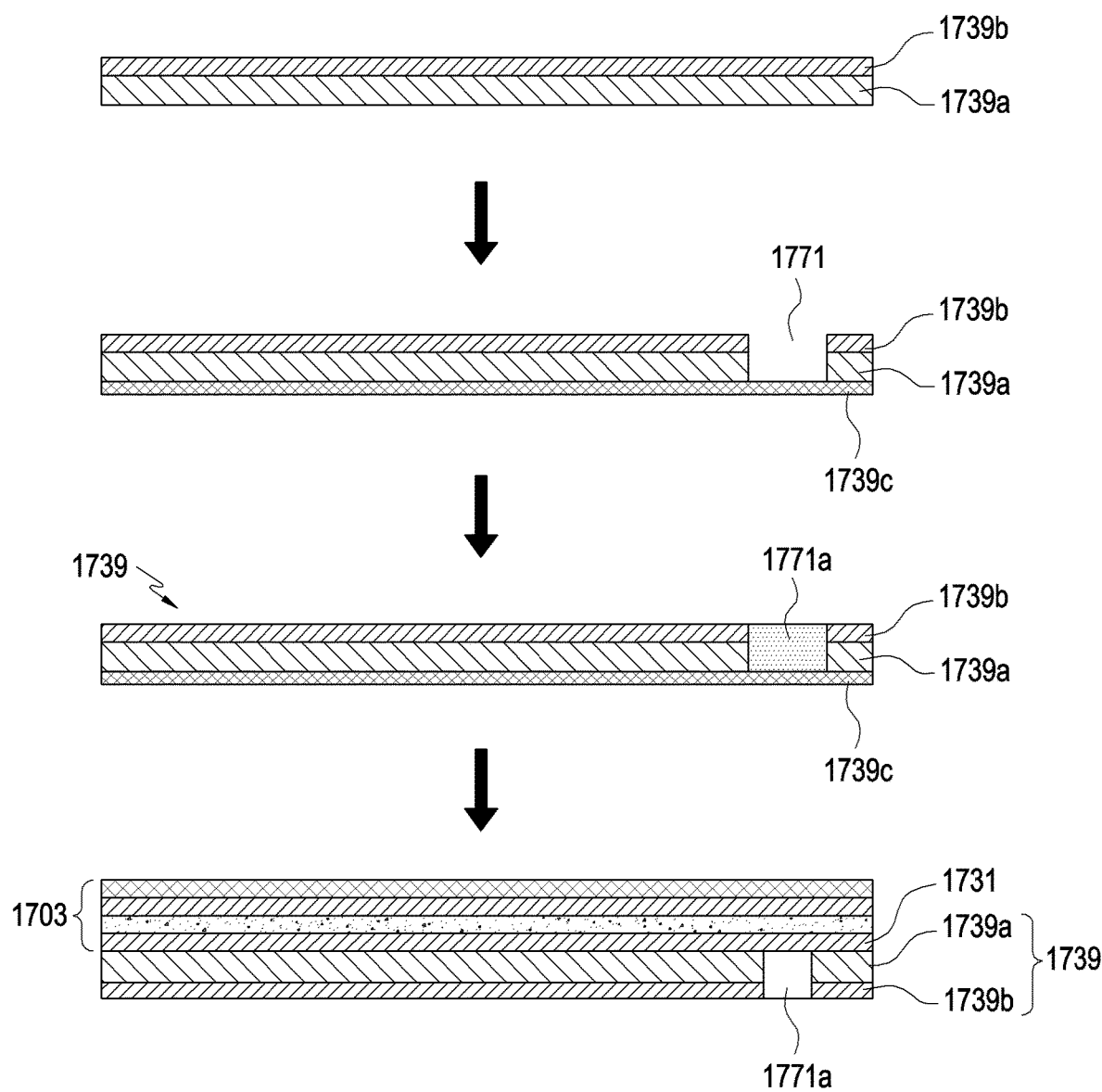
FIGS. 18 to 20 are views each for describing a process of manufacturing a protective layer in a flexible display of an electronic device according to various embodiments of the disclosure.
Figure 19:
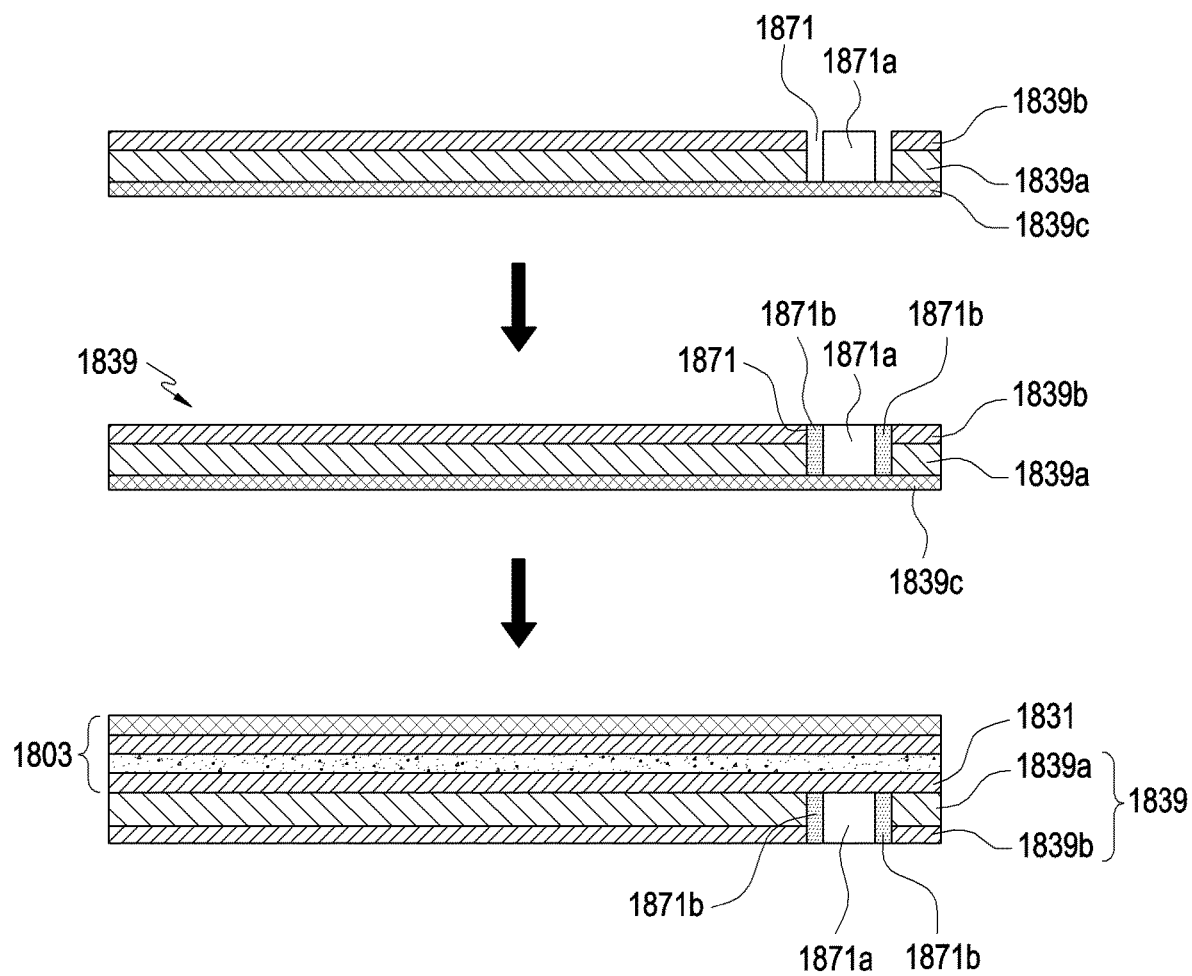
Figure 20:
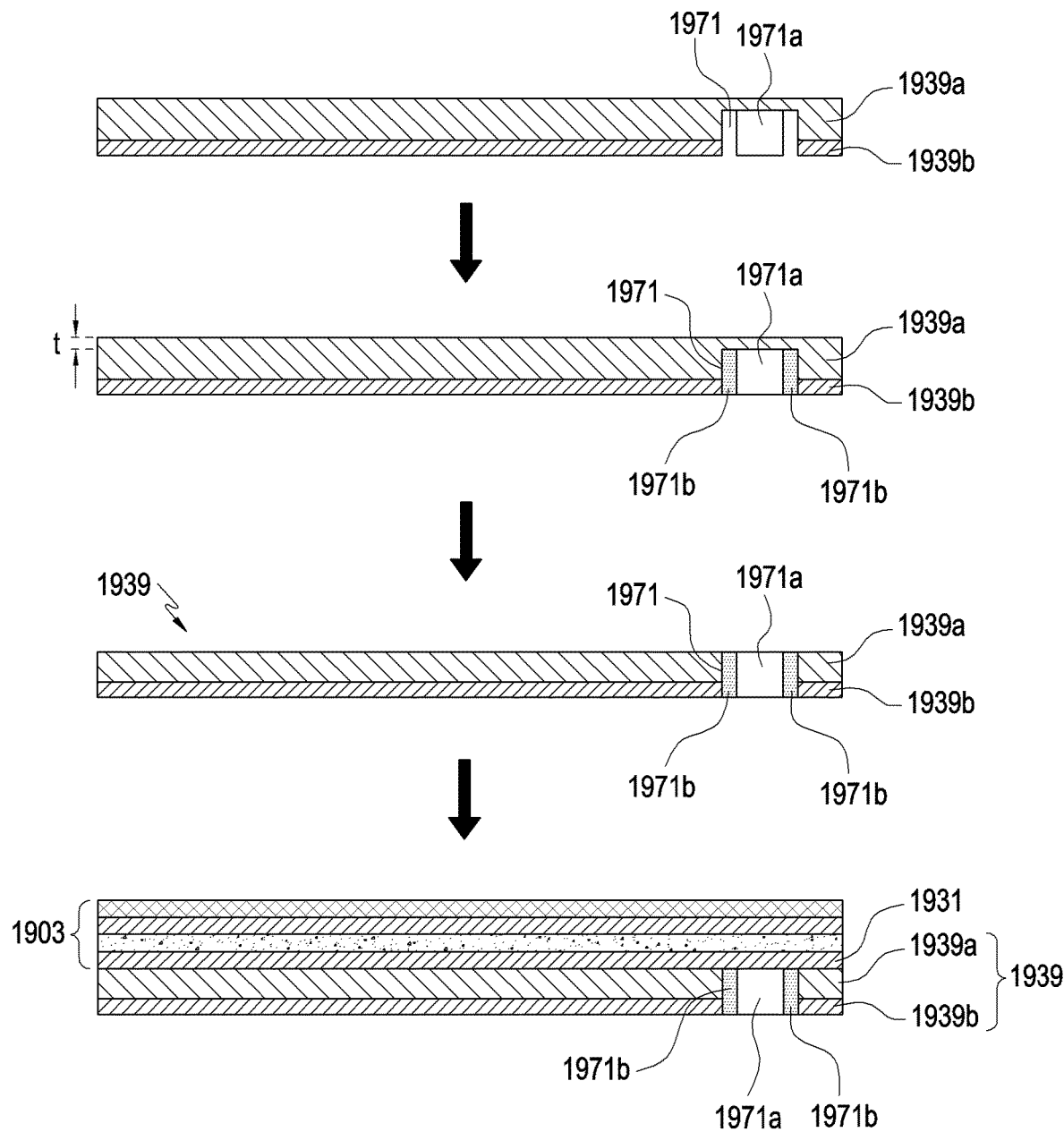

FIGS. 18 to 20 are views each for describing a process of manufacturing a protective layer in a flexible display of an electronic device according to various embodiments of the disclosure.

The illustrated protective layers illustrated in FIGS. 18 to 20 may be attached or laminated to the rear face of a display (e.g., the display 1603 in FIG. 17), for example, a light-emitting layer or a second window (e.g., the light-emitting layer 1631 or the second window 1637b in FIG. 17).

Each of FIGS. 18 to 20 illustrates an operation of forming a second opening 1771, 1871, or 1971 in an opaque layer, for example, a protective layer 1739, 1839, or 1939 (e.g., the protective layer 639 in FIG. 7), and mounting a transparent synthetic resin material 1771a, 1871b, or 1971b or a transparent synthetic resin plate 1871a or 1971a in the second opening 1771, 1871, or 1971.

Referring to FIG. 18, in the protective layer 1739 including a cushion layer 1739a and an electromagnetic shielding layer 1739b, an opening 1771 (e.g., the second opening 671 in FIG. 7) may be formed by removing a portion of the cushion layer 1739a or the electromagnetic shielding layer 1739b. In some embodiments, the opening 1771 may be formed as a structure in which a portion of the cushion layer 1739a (or the electromagnetic shielding layer 1739b) is completely separated from the other portion. When the protective layer 1739 further includes a base film 1739c, it is possible to prevent the two separate portions of the cushion layer 1739a (or the electromagnetic shielding layer 1739b) from falling off of each other. For example, the base film 1739c may be attached to the outer face of the cushion layer 1739a, and even if the opening 1771 is formed, the base film 1739c may not be removed. For example, by forming the opening 171 in the state in which the base film 1739c is attached, it is possible to prevent an area other than the portion forming the opening 171 in the cushion layer 1739a (or the electromagnetic shielding layer 1739b) from being removed.

According to various embodiments, the opening 1771 may be filled with a transparent synthetic resin material, for example, a transparent resin 1771a, and the opening 1771 may transmit light substantially without loss. In some embodiments, the transparent synthetic resin material 1771a may provide uniform thickness, stiffness or flexibility in the entire area of at least the protective layer 1739 or the display (e.g., the flexible display 603 in FIG. 7) including the protective layer 1739, even in the area where the opening 1771 is formed. For example, visual or tactile heterogeneity (e.g., heterogeneity that may occur on the outer face of the display provided with the protective layer 1739) may be relieved by the transparent synthetic resin material 1771a.

According to various embodiments, the protective layer 1739 manufactured as described above may be attached or laminated to the light-emitting layer 1731 of the display 1703. When attached to the display 1703, the cushion layer 1739a may be attached to the light-emitting layer 1731 in the state in which the base film 1739c is removed. In another embodiment, the base film 1739c may be used as a second window (e.g., the second window 1637b in FIG. 17) of the display 1703. For example, when attached to the display 1703, the base film 1739c may be attached to the light-emitting layer 1731.

Referring to FIG. 19, a transparent synthetic resin plate 1871a, for example, the lens 1371a or 1571a in FIG. 14 or FIG. 16, may be further provided in the opening 1871 formed in the cushion layer 1839a or the electromagnetic shielding layer 1839b. In the state in which the opening is formed, the transparent synthetic resin plate 1871a may be disposed in the opening 1871 in the state of being substantially attached to the base film 1839c. In the state in which the transparent synthetic resin plate 1871a is disposed, the inside of the opening 1871 (e.g., a gap between the outer peripheral face of the transparent synthetic resin plate 1871a and the inner wall of the opening 1871) may be filled with the transparent synthetic resin material 1871b. For example, the transparent synthetic resin material 1871b may cure in the state of being provided to at least partially surround the transparent synthetic resin plate 1871a, and may fix the transparent synthetic resin plate 1871a in the opening 1871.

According to various embodiments, the protective layer 1839 manufactured as described above may be attached or laminated to the light-emitting layer 1831 of the display 1803. When attached to the display 1803, the cushion layer 1839a may be attached to the light-emitting layer 1831 in the state in which the base film 1839c is removed. In another embodiment, the base film 1839c may be used as a second window (e.g., the second window 1637b in FIG. 17) of the display 1803. For example, when attached to the display 1803, the base film 1839c may be attached to the light-emitting layer 1831.

According to various embodiments, optical adhesive may be used in attaching the base film 1739c or 1839c of FIG. 18 or FIG. 19 to the light-emitting layer 1731 or 1831. In some embodiments, the base film 1739c or 1839c may be manufactured to be substantially transparent, in which case there is no need to form a separate transparent area or opening in an area corresponding to the transparent synthetic resin plate 1871a.

According to various embodiments of the disclosure, even if a base film (e.g., the base film 1739c or 1839c in FIG. 18 or FIG. 19) is not used, it is possible to prevent a portion of the protective layer (e.g., the protective layer 1739 or 1839 in FIG. 18 or FIG. 19) from falling off in the process of forming the opening or to facilitate arrangement of the transparent synthetic resin plate (e.g., the transparent synthetic resin plate 1871a in FIG. 19). Referring to FIG. 20, after forming the cushion layer 1939a constituting the protective layer 1939 to a sufficient thickness, the opening 1971 may be formed in the form of a groove extending from the electromagnetic shielding layer 1939b (e.g., in the form of a hole closed in one face of the protective layer 1939). For example, when viewed from the surface of the cushion layer 1939a, the opening may not be substantially formed.

In an embodiment, after attaching the transparent synthetic resin plate 1971a to the closed end wall of the hole, the transparent synthetic resin plate 1971 may be fixed in the hole by filling the inside of the hole with the transparent synthetic resin material 1971b and curing the transparent synthetic resin material 1971b. In another embodiment, after the transparent synthetic resin plate 1971a is completely fixed in the hole, a process of partially removing the thickness t of the cushion layer 1939a, for example, a face-milling process, is performed, thereby forming a protective layer 1939 having a designed thickness. In some embodiments, after the face-milling process is performed, it is possible to adjust the surface roughness, flatness, or the like of the cushion layer 1939a or the transparent synthetic resin plate 1971a. For example, after the face-milling process, a polishing process may be performed so as to process the face to be attached to the light-emitting layer (e.g., the light-emitting layer 631 in FIG. 7) in the protective layer 1939. When the face-milling process or the polishing process is completed, the transparent synthetic resin plate 1971a may also be exposed on the surface of the cushion layer 1939a. For example, an opening (e.g., the second opening 671 in FIG. 7) penetrating both faces of the protective layer 1939 may be completed in the state in which the transparent synthetic resin plate 1971a is mounted.

According to various embodiments, the protective layer 1939 manufactured as described above may be attached or laminated to the light-emitting layer 1931 of the display 1903. When attached to the display 1903, the cushion layer 1839a may be attached to the light-emitting layer 1831. In another embodiment, the cushion layer 1839a may be attached to the light-emitting layer 1831 using an optical adhesive.

An electronic device (e.g., the electronic device 101 or 300 in FIG. 1 or FIG. 3) according to various embodiments of the disclosure may include:

a housing (e.g., the first structure or slide housing 302a in FIG. 3 or the housing 1202a in FIG. 12) including a recess (e.g., the recess R in FIG. 3 or FIG. 12);

an inner plate (e.g., the inner plate I in FIG. 3 or 12) disposed to at least partially surround the housing, wherein the inner plate includes a first face (e.g., the first face F1 in FIG. 12) facing away from the recess, a second face (e.g., the second face F2 in FIG. 12) facing the recess, and a first opening (e.g., the first opening 329 or 1129 in FIG. 3 or FIG. 12) formed through the inner plate;

a display layer (e.g., the flexible display 303 or 603 in FIG. 3 or FIG. 7) mounted on the first face of the inner plate, wherein the display layer includes at least one substantially transparent layer (e.g., the window 637 in FIG. 7) including a flexible layer forming the outer face of the display layer, at least one substantially opaque layer (e.g., the protective layer 639 in FIG. 7) disposed between the transparent layer and the inner plate, wherein the opaque layer may include a second opening (e.g., the second opening 671 in FIG. 7) overlapping the first opening when viewed from above the display layer, and a transparent polymeric material (e.g., the transparent polymeric material 1171 in FIG. 12) filling at least a portion of the second opening; and an image sensor (e.g., the sensor 607 in FIG. 7) disposed in the recess to face the first opening.

According to various embodiments, the housing may include a side member (e.g., the side member S in FIG. 3) at least partially surrounding the recess when viewed from above the display layer, and the inner plate may extend from the side member.

According to various embodiments, the at least one substantially transparent layer may include a polyimide layer forming the outer face.

According to various embodiments, the at least one substantially opaque layer may include at least one of a sponge layer and a graphite layer.

According to various embodiments, the transparent polymeric material may include a resin.

According to various embodiments, the electronic device may further include a transparent polymeric plate (e.g., the lens structure 1571a in FIG. 16) disposed in the second opening, and the transparent polymeric material may at least partially surround the transparent polymeric plate when viewed from above the display layer.

According to various embodiments, the display layer may further include a light-emitting layer interposed between the transparent layer (e.g., the light-emitting layer 631 in FIG. 7) and the opaque layer, and a first transparent area (e.g., the first transparent area 631a in FIG. 7) formed to correspond to the second opening.

According to various embodiments, the display layer may further include a polarization plate (e.g., the polarization plate 633 in FIG. 7) laminated between the transparent layer and the light-emitting layer or a touch screen panel (e.g., the touch screen panel 635 in FIG. 7), and at least the touch screen panel may include a second transparent area (e.g., the second transparent area 635a in FIG. 7) aligned with the first transparent area.

According to various embodiments, the display layer may further include another transparent layer (hereinafter, referred to as a "second transparent layer (e.g., the second window 1637b in FIG. 17)) disposed on the rear face of the light-emitting layer.

According to various embodiments, the opaque layer may include a digitizer (e.g., an embodiment of the protective layer 639 in FIG. 7) configured to detect input performed by electromagnetic resonance or electromagnetic induction.

According to various embodiments, the display layer may further include a light-shielding layer (e.g., the light-shielding layer 937a in FIG. 10) formed on the inner face of the transparent layer, and the light-shielding layer may be formed to correspond to an area around the second opening.

According to various embodiments of the disclosure, an electronic device may include:

a flexible display including a window film, a protective layer provided on the inner face of the window film, and a light-emitting layer provided between the window film and the protective layer;

a first transparent region formed on the light-emitting layer and configured to transmit light; and a sensor disposed on the inner face of the protective layer at a position corresponding to the first transparent area.

The protective may include an opening formed to correspond to the first transparent area.

According to various embodiments, the display layer may further include a light-shielding layer formed on the inner face of the window film, and the light-shielding layer may be formed to correspond to an area around the first transparent area.

According to various embodiments, the light-emitting layer may include a dummy area that does not emit light, and the first transparent region may include at least a portion of the dummy area.

According to various embodiments, the display layer may further include a light-shielding layer formed on the inner face of the window film, and the light-shielding layer may be formed to correspond to the dummy area in the area around the first transparent area.

According to various embodiments, the electronic device may further include a lens structure disposed in the opening, a flange portion formed at the periphery of the lens structure, and a transparent resin filling at least a portion of a gap between the inner wall of the opening and the lens structure, and a portion of the sensor may be bonded to the flange portion.

According to various embodiments, the electronic device may further include a transparent resin filling the inside of the opening.

According to various embodiments, the electronic device may further include a support plate disposed between the flexible display and the sensor and another opening formed in the support plate, wherein the another opening in the support plate may be aligned with the opening in the protective layer.

According to various embodiments, the electronic device may further include an image signal processor, the sensor may detect information about light incident through the first transparent area, and the image signal processor may be configured to generate an image based on information detected through the sensor.

According to various embodiments of the disclosure, an electronic device may include:

a guide housing (e.g., the second structure 301 or guide housing in FIG. 3);

a slide housing (e.g., the first structure 302a or the slide housing in FIG. 3) slidably coupled to the guide housing, wherein the slide housing includes an inner plate (e.g., the inner plate I in FIG. 3) having a first face (e.g., the first face F1 in FIG. 3) facing the outside of the electronic device and a second face facing away from the first face, and a first opening (e.g., the first opening 329 in FIG. 3) formed to penetrate the first face and the second face;

a display (e.g., the display 303 in FIG. 3) mounted on the first face, wherein the display includes a substantially transparent window (e.g., the window 637 or the window film in FIG. 7) including a flexible area forming the outer face of the display, a light-emitting layer (e.g., the light-emitting layer 631 in FIG. 7) disposed under the window, a substantially opaque protective layer (e.g., the protective layer 639 in FIG. 7) disposed under the light-emitting layer, and a second opening (e.g., the second opening 671 in FIG. 7) formed in the protective layer to at least partially overlap the first opening in a vertical direction;

a transparent polymeric material (e.g., the transparent polymeric material 1171 in FIG. 12) filling at least a portion of the second opening; and an image sensor (e.g., the sensor 607 in FIG. 7) at least partially accommodated in the guide housing and at least partially aligned with the first opening under the inner plate.

According to various embodiments, the slide housing may include a side member (e.g., the side member S in FIG. 3) forming at least a portion of the side face of the electronic device, and the inner plate may extend from the side member.

According to various embodiments, the window may include a polyimide layer forming the outer face.

According to various embodiments, the protective layer may include at least one of a sponge layer and a graphite layer.

According to various embodiments, the transparent polymeric material may include a resin.

According to various embodiments, in the second opening, a polymeric plate (e.g., the lens 1371a in FIG. 14) may be disposed to be at least partially surrounded by the transparent polymeric material.

According to various embodiments, a pixel for light emission may not be formed in a partial area (e.g., the transparent area 631a in FIG. 7) of the light-emitting layer corresponding to the second opening, and pixels may be formed in another area around the partial area.

According to various embodiments, the display layer may further include a polarization plate (e.g., the polarization plate 633 in FIG. 7) disposed between the transparent layer and the light-emitting layer or a touch screen panel (e.g., the touch screen panel 635 in FIG. 7).

A sensor for detecting touch may not be formed in a partial area of the touch screen panel corresponding to the second opening.

According to various embodiments, the display may further include another window (e.g., the second window 1637b in FIG. 17) disposed between the light-emitting layer and the protective layer.

According to various embodiments, the protective layer may include a digitizer (e.g., the digitizer 639c in FIG. 7) configured to detect input performed by electromagnetic resonance or electromagnetic induction.

According to various embodiments, the protective layer may include a cushion layer (e.g., the cushion layer 639a in FIG. 7) for protecting the light-emitting layer (e.g., the shielding layer 639b in FIG. 7) from an impact and a shielding layer for blocking electromagnetic waves.

According to various embodiments, the display may further include a light-shielding layer formed only on at least a portion of an area around an area corresponding to the second opening in the inner face of the window.

According to various embodiments of the disclosure, an electronic device may include:

a housing;

a flexible display at least partially accommodated in the housing, wherein the flexible display includes a window forming at least a portion of the outer surface of the electronic device, a light-emitting layer disposed under the window, and a protective layer disposed under the light-emitting layer, wherein a transparent area is formed in a partial area of the light-emitting layer so as to transmit light incident from the outside of the electronic device, and wherein an opening at least partially aligned with the transparent area is formed in a partial area of the protective layer; and a sensor at least partially accommodated in the housing and at least partially aligned with the opening.

According to various embodiments, in a peripheral area of an inner face of the window, the flexible display may further include a light-shielding layer formed on at least a portion of an area corresponding to an area around the transparent area.

According to various embodiments, a pixel for light emission may not be formed in at least a portion of the transparent area.

According to various embodiments, the electronic device may further include:

a lens disposed in the opening to form a sensor assembly together with the sensor; and at least a portion of a space between the inner wall of the opening and the lens may be filled with a transparent member.

According to various embodiments, at least a partial area of the opening may be filled with a transparent member.

According to various embodiments, the electronic device may further include:
a support plate disposed between the flexible display and the sensor; and
another opening formed in the support plate.

The another opening in the support plate may be aligned with the opening in the protective layer.

According to various embodiments, the electronic device may further include an image signal processor,
the sensor may generate information corresponding to at least part of the light obtained by passing through the transparent area from the outside of the electronic device, and
the image signal processor may be configured to generate an image based on the information corresponding to the light.

According to various embodiments of the disclosure, an electronic device may include:
an inner plate including a first opening;
at least one transparent window including a flexible layer forming a portion of the outer face of the electronic device;
at least one protective layer disposed under the window, wherein the protective layer includes a second opening overlapping the first opening when viewed from above the window; and
a transparent polymeric material filling at least a portion of the second opening.

In the foregoing detailed description, specific embodiments of the disclosure have been described. However, it will be evident to a person ordinarily skilled in the art that various modifications may be made without departing from the scope of the disclosure.

The invention claimed is:

1. An electronic device comprising:
a guide housing;
a slide housing slidably coupled to the guide housing, wherein the slide housing includes an inner plate having a first face that faces an outside of the electronic device and a second face that faces away from the first face, and a first opening formed to penetrate the first face and the second face;
a display mounted on the first face, wherein the display includes a substantially transparent window including a flexible area forming an outer face of the display, a light-emitting layer disposed under the window, a substantially opaque protective layer disposed under the light-emitting layer, and a second opening formed in the protective layer and at least partially overlapping the first opening in a vertical direction;
a transparent polymeric material filling at least a portion of the second opening; and
an image sensor at least partially accommodated in the guide housing and at least partially aligned with the first opening under the inner plate.

2. The electronic device of claim 1, wherein the slide housing includes a side member forming at least a portion of a side face of the electronic device, and the inner plate extends from the side member.

3. The electronic device of claim 1, wherein the window includes a polyimide layer forming the outer face.

4. The electronic device of claim 1, wherein a polymeric plate is arranged to be at least partially surrounded by the transparent polymeric material.

5. The electronic device of claim 1, wherein a pixel for light emission is not formed in a partial area of the light-emitting layer corresponding to the second opening, and pixels are formed in another area around the partial area.

6. The electronic device of claim 1, wherein the display further includes a polarization layer or a touch screen panel disposed between the window and the light-emitting layer, and
a sensor for detecting touch is not formed in a partial area of the touch screen panel corresponding to the second opening.

7. The electronic device of claim 1, wherein the display further includes another window disposed between the light-emitting layer and the protective layer.

8. The electronic device of claim 1, wherein the protective layer includes a digitizer configured to detect input performed by electromagnetic resonance or electromagnetic induction.

9. The electronic device of claim 1, wherein the protective layer includes a cushion layer configured to protect the light-emitting layer from an impact and a shielding layer configured to shield electromagnetic waves.

10. The electronic device of claim 1, wherein the display further includes a light-shielding layer formed only on at least a portion of an area around an area corresponding to the second opening in an inner face of the window.

11. An electronic device comprising:
a housing;
a flexible display at least partially accommodated in the housing, wherein the flexible display includes a window forming at least a portion of the outer surface of the electronic device, a light-emitting layer disposed under the window, and a protective layer disposed under the light-emitting layer, and wherein a transparent area is formed in a partial area of the light-emitting layer so as to transmit light incident from outside the electronic device, and an opening at least partially aligned with the transparent area is formed in a partial area of the protective layer; and
a sensor at least partially accommodated in the housing and at least partially aligned with the opening.

12. The electronic device of claim 11, wherein, in a peripheral area of an inner face of the window, the flexible display further includes a light-shielding layer formed on at least a portion of an area corresponding to an area around the transparent area.

13. The electronic device of claim 11, further comprising:
a lens disposed in the opening to form a sensor assembly together with the sensor,
wherein at least a portion of a space between the inner wall of the opening and the lens is filled with a transparent member.

14. The electronic device of claim 11, wherein at least a partial area of the opening is filled with a transparent member.

15. The electronic device of claim 11, further comprising:
a support plate disposed between the flexible display and the sensor; and
another opening formed in the support plate,
wherein the another opening in the support plate is aligned with the opening in the protective layer.

* * * * *